United States Patent
Kolla et al.

(10) Patent No.: US 9,977,480 B2
(45) Date of Patent: May 22, 2018

(54) SELECTIVE COUPLING OF POWER RAILS TO A MEMORY DOMAIN(S) IN A PROCESSOR-BASED SYSTEM

(71) Applicant: QUALCOMM Incorporated, San Diego, CA (US)

(72) Inventors: Yeshwant Nagaraj Kolla, Wake Forest, NC (US); Neel Shashank Natekar, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 79 days.

(21) Appl. No.: 15/087,377

(22) Filed: Mar. 31, 2016

(65) Prior Publication Data

US 2016/0306412 A1 Oct. 20, 2016

Related U.S. Application Data

(60) Provisional application No. 62/147,862, filed on Apr. 15, 2015.

(51) Int. Cl.
*G06F 1/32* (2006.01)
*G06F 1/26* (2006.01)
(Continued)

(52) U.S. Cl.
CPC ............ *G06F 1/3234* (2013.01); *G06F 1/263* (2013.01); *G06F 1/3287* (2013.01); *G11C 5/063* (2013.01); *G11C 5/147* (2013.01); *Y02B 60/1282* (2013.01)

(58) Field of Classification Search
CPC ...... G06F 1/3234; G06F 1/3287; G06F 1/263; G11C 5/063; G11C 5/147
See application file for complete search history.

(56) References Cited

U.S. PATENT DOCUMENTS 7,498,836 B1 3/2009 Tuan
7,589,584 B1 9/2009 Bui
(Continued)

FOREIGN PATENT DOCUMENTS

KR 20010005090 A 1/2001

OTHER PUBLICATIONS

Second Written Opinion for PCT/US2016/027197, dated Mar. 7, 2017, 6 pages.
(Continued)

*Primary Examiner* — Stefan Stoynov
(74) *Attorney, Agent, or Firm* — WT&T/Qualcomm

(57) ABSTRACT

Selective coupling of power rails to memory domain(s) in processor-based system, such as to reduce or avoid the need to provide intentional decoupling capacitance in logic domain(s) is disclosed. To avoid or reduce providing additional intentional decoupling capacitance in logic domain to mitigate voltage droops on logic power rail, power rail selection circuit is provided. The power rail selection circuit is configured to couple memory domain to a logic power rail when the logic power rail can satisfy a minimum operating voltage of memory arrays. The additional intrinsic decoupling capacitance of the memory arrays is coupled to the logic power rail. However, if the operating voltage of the logic power rail is scaled down below the minimum operating voltage of the memory arrays when the logic domain does not need higher operation functionality, the power rail selection circuit is configured to couple the memory domain to separate memory power rail.

46 Claims, 14 Drawing Sheets

(51) Int. Cl.
*G11C 5/06* (2006.01)
*G11C 5/14* (2006.01)

(56) References Cited

U.S. PATENT DOCUMENTS

| | | | |
|---|---|---|---|
| 7,737,720 | B2 | 6/2010 | Idgunji et al. |
| 7,786,870 | B2 | 8/2010 | Zettler |
| 8,138,795 | B2 | 3/2012 | Hseih et al. |
| 8,139,436 | B2 * | 3/2012 | Chen ............... G11C 11/412 365/189.09 |
| 8,595,671 | B2 | 11/2013 | He |
| 8,605,534 | B2 * | 12/2013 | Lee ............... G11C 5/14 365/226 |
| 8,635,572 | B1 | 1/2014 | Jin et al. |
| 9,001,572 | B2 | 4/2015 | Choi et al. |
| 9,059,696 | B1 | 6/2015 | Rahman |
| 9,225,175 | B2 | 12/2015 | Kim |
| 9,337,660 | B1 | 5/2016 | Bourstein |
| 9,785,181 | B2 | 10/2017 | Ichino |
| 9,825,468 | B1 | 11/2017 | Bryson et al. |
| 2001/0052758 | A1 | 12/2001 | Odaohhara |
| 2002/0158683 | A1 | 10/2002 | Berthold |
| 2007/0210750 | A1 | 9/2007 | Cha |
| 2008/0043560 | A1 | 2/2008 | Ko et al. |
| 2008/0284407 | A1 | 11/2008 | Miermont et al. |
| 2010/0254209 | A1 | 10/2010 | Lee et al. |
| 2012/0117391 | A1 | 5/2012 | Jacquet et al. |
| 2014/0097702 | A1 | 4/2014 | Upputuri et al. |
| 2014/0167813 | A1 | 6/2014 | Raychowdhury et al. |
| 2015/0067290 | A1 | 3/2015 | Chaba et al. |
| 2015/0082065 | A1 | 3/2015 | Bose et al. |
| 2016/0308372 | A1 | 10/2016 | Kolla et al. |
| 2017/0346299 | A1 | 11/2017 | Sridhar et al. |

OTHER PUBLICATIONS

Bhardwaj, Nitin, "Decoupling Capacitance," Electrical & Computer Engineering, University of Rochester, NY, Date Unknown, 4 pages.

International Search Report and Written Opinion for PCT/US2016/027197, dated Jun. 20, 2016, 11 pages.

Cheng, Wayne H. et al., "Dynamic Voltage and Frequency Scaling Circuits with Two Supply Voltages," IEEE International Symposium on Circuits and Systems, ISCAS 2008, May 18, 2008, pp. 1236-1239.

International Preliminary Report on Patentability for PCT/US2016/027197, dated Aug. 1, 2017, 32 pages.

\* cited by examiner

| LOGIC POWER (204L) VOLTAGE ON LOGIC POWER RAIL (202L) | MEMORY POWER (204M) VOLTAGE ON MEMORY POWER RAIL (202M) | MEMORY DOMAIN (214) VOLTAGE |
|---|---|---|
| 1.00 | 0.80 | LOGIC POWER (204L) = 1.00 |
| 0.90 | 0.80 | LOGIC POWER (204L) = 0.90 |
| 0.80 | 0.80 | LOGIC POWER (204L) = 0.80 |
| 0.70 | 0.80 | MEMORY POWER (204M) = 0.80 |
| 0.60 | 0.80 | MEMORY POWER (204M) = 0.80 |

FIG. 3

POWER RAIL CONTROL CIRCUIT (224)

600(2)

| | HIGH IMPEDANCE PATH SELECTION SIGNAL (517) | LOGIC/MEMORY TOGGLE SIGNAL (516) | MEMORY POWER RAIL ENABLE SIGNAL (508M) | LOGIC POWER RAIL ENABLE SIGNAL (508L) | ARRAY POWER RAIL (202A) MODE |
|---|---|---|---|---|---|
| 604(1) | 1 | 0 | 1 | 0 | INIT: MEMORY POWER RAIL (202M) THROUGH PFETs (514(1), 514(2)) |
| 604(2) | 1 | 0 | 0 | 0 | MEMORY POWER RAIL (202M) THROUGH PFET (514(2)) |
| 604(3) | 1 | 1 | 0 | 0 | LOGIC POWER RAIL (202L) THROUGH PFET (506(2)) |
| 604(4) | 1 | 1 | 0 | 0 | SLOW RAMP-UP TO LOGIC POWER RAIL (202L) |
| 604(5) | 1 | 1 | 0 | 1 | LOGIC POWER RAIL (202L) THROUGH PFETS (506(1), 506(2)) |

FIG. 6B

POWER RAIL CONTROL CIRCUIT (224)

800(1)

| | MEMORY SELECT SIGNAL (700M) | LOGIC SELECT SIGNAL (700L) | MEMORY POWER RAIL ENABLE SIGNAL (508M) | LOGIC POWER RAIL ENABLE SIGNAL (508L) | ARRAY POWER RAIL (202A) MODE |
|---|---|---|---|---|---|
| 802(1) | 0 | 1 | 0 | 1 | INIT: LOGIC POWER RAIL (202L) THROUGH PFETs (506(1), 506(2)) |
| 802(2) | 0 | 1 | 0 | 0 | LOGIC POWER RAIL (202L) THROUGH PFET (506(2)) |
| 802(3) | 1 | 1 | 0 | 0 | MEMORY POWER RAIL (202M) THROUGH PFET (514(2)) LOGIC POWER RAIL (202L) THROUGH PFET (506(2)) |
| 802(4) | 1 | 0 | 0 | 0 | SLOW RAMP-UP TO MEMORY POWER RAIL (202M) |
| 802(5) | 1 | 0 | 1 | 0 | MEMORY POWER RAIL (202M) THROUGH PFETS (514(1), 514(2)) |

*FIG. 8A*

| MEMORY RETENTION SIGNAL (526) | HIGH IMPEDANCE PATH SELECTION SIGNAL (517) | LOGIC/ MEMORY TOGGLE SIGNAL (516) | MEMORY POWER RAIL ENABLE SIGNAL (508M) | LOGIC POWER RAIL ENABLE SIGNAL (508L) | ARRAY POWER RAIL (202A) MODE |
|---|---|---|---|---|---|
| 0 | 1 | 1 | 0 | 1 | INIT: LOGIC POWER RAIL (202L) THROUGH PFETs (506(1), 506(2)) |
| 1 | 1 | 1 | 0 | 0 | LOGIC POWER RAIL (202L) THROUGH PFET (506(2)) MEMORY POWER RAIL (202M) THROUGH NFET (524) |
| 1 | 0 | 0 | 0 | 0 | MEMORY POWER RAIL (202M) THROUGH NFET (524) IN DIODE-DROP MODE |
| 1 | 1 | 0 | 0 | 0 | MEMORY POWER RAIL (202M) THROUGH PFET (514(2)) MEMORY POWER RAIL (202M) THROUGH NFET (524) |
| 0 | 1 | 0 | 0 | 0 | SLOW RAMP-UP TO MEMORY POWER RAIL (202M) |
| 0 | 1 | 0 | 1 | 0 | MEMORY POWER RAIL (202M) THROUGH PFETs (514(1), 514(2)) |

*FIG. 10A*

| MEMORY RETENTION SIGNAL (526) | HIGH IMPEDANCE PATH SELECTION SIGNAL (517) | LOGIC/ MEMORY TOGGLE SIGNAL (516) | MEMORY POWER RAIL ENABLE SIGNAL (508M) | LOGIC POWER RAIL ENABLE SIGNAL (508L) | ARRAY POWER RAIL (202A) MODE |
|---|---|---|---|---|---|
| 0 | 1 | 0 | 1 | 0 | INIT. MEMORY POWER RAIL (202M) THROUGH PFETs (514(1), 514(2)) |
| 1 | 1 | 0 | 0 | 0 | MEMORY POWER RAIL (202M) THROUGH PFET (514(2)) MEMORY POWER RAIL (202M) THROUGH NFET (524) |
| 1 | 0 | 1 | 0 | 0 | MEMORY POWER RAIL (202M) THROUGH NFET (524) IN DIODE-DROP MODE |
| 1 | 1 | 1 | 0 | 0 | LOGIC POWER RAIL (202L) THROUGH PFET (506(2)) MEMORY POWER RAIL (202M) THROUGH NFET (524) |
| 0 | 1 | 1 | 0 | 0 | SLOW RAMP-UP TO LOGIC POWER RAIL (202L) |
| 0 | 1 | 1 | 0 | 1 | LOGIC POWER RAIL (202L) THROUGH PFETs (506(1), 506(2)) |

*FIG. 10B*

SELECTIVE COUPLING OF POWER RAILS TO A MEMORY DOMAIN(S) IN A PROCESSOR-BASED SYSTEM

PRIORITY APPLICATION

The present application claims priority under 35 U.S.C. § 119(e) to U.S. Provisional Patent Application Ser. No. 62/147,862, filed on Apr. 15, 2015, and entitled "SELECTIVE COUPLING OF POWER RAIL(S) TO MEMORY DOMAIN(S) IN A MICROPROCESSOR-BASED SYSTEM TO REDUCE INTENTIONAL DECOUPLING CAPACITANCE IN LOGIC DOMAIN(S)," which is incorporated herein by reference in its entirety.

BACKGROUND

I. Field of the Disclosure

The technology of the disclosure relates generally to a processor-based system employing multiple voltage domains.

II. Background

Circuits are increasingly being designed with power conservation in mind. This is particularly the case for portable electronic devices that are battery-powered. Common examples include mobile phones and laptop computers, among others. Increased power consumption undesirably results in faster battery drainage and shorter battery life. One method of conserving power is to lower an operating frequency of the circuit according to the active power equation $P=CV^2f$. However, reducing the operating frequency results in lower circuit performance (i.e., speed). Another method of conserving power is to lower the operating voltage, since generally, active power reduces quadratically for a given reduction in operating voltage. However, lowering the operating voltage in a circuit lowers speed performance, which may also be undesirable. Further, certain cells or components of a circuit may have a minimum operating voltage below which they will not operate to read and write data, as well as retain data.

To address the tradeoff between performance and power consumption, multiple operating voltage domains ("voltage domains") are increasingly being provided in circuits. Circuit paths are provided which pass through the multiple voltage domains to provide different operating voltages to different components of a circuit. Providing multiple voltage domains allows a lower voltage domain to provide power to components that do not require minimum voltage levels to conserve power. Components that either have a minimum operating voltage for memory operation functionality or provide critical paths where performance cannot be sacrificed may be powered by the higher voltage domain. Providing multiple voltage domains also allows the lower voltage domain to be scaled-down to conserve power during a power conservation mode, or scaled-up to provide for increased performance (i.e., hyper-performance), without affecting the operation of the components in the higher voltage domain.

In this regard, FIG. 1 is a block diagram of an exemplary processor-based system 100. A logic power rail 102L and a memory power rail 102M are provided in the processor-based system 100. The logic power rail 102L is provided to provide logic power 104 from a logic power supply to logic blocks 106(1)-106(M) in a logic domain 108 in the processor-based system 100, where 'M' represents any number of logic blocks 106 desired. The memory power rail 102M is provided to provide memory power 110 from a memory power supply to memory arrays 112(1)-112(N) in a memory domain 114, where 'N' represents any number of memory arrays 112 desired. Power switches 116(1)-116(M) may be provided to control coupling the respective logic blocks 106(1)-106(M) to the logic power rail 102L. Power switches 118(1)-118(N) may also be provided to control coupling the respective memory arrays 112(1)-112(N) to the memory power rail 102M. Separate logic and memory power rails 102L, 102M are provided to provide two (2) separate voltage domains in the processor-based system 100, because it may be desired to scale down (i.e., lower) and/or collapse the voltage of the logic power rail 102L during lower power modes. If the memory arrays 112(1)-112(N) were powered through the logic power rail 102L, the logic power rail 102L could only be lowered in voltage to a minimum operating voltage needed for memory retention in the memory arrays 112(1)-112(N). The minimum operating voltage for memory arrays is conventionally higher than for logic circuits.

However, by providing the separate logic power rail 102L and memory power rail 102M in the processor-based system 100 in FIG. 1, the intrinsic decoupling capacitance present in the memory arrays 112(1)-112(N) is not coupled to the logic power rail 102L. Thus, additional intentional decoupling capacitance may need to be added to the logic blocks 106(1)-106(M) at the expense of area and leakage power, to mitigate or avoid voltage droops from occurring on the logic power rail 102L caused by transient current draw events by the logic blocks 106(1)-106(M).

SUMMARY OF THE DISCLOSURE

Aspects disclosed in the detailed description include selective coupling of power rails to a memory domain(s) in a processor-based system, such as to reduce or avoid the need to provide intentional decoupling capacitance in a logic domain(s). In this regard, in one exemplary aspect, a separate logic power rail coupled to a logic power supply and a memory power rail coupled to a memory power supply are provided. This allows logic circuits in a logic domain to be separately powered from memory arrays in a memory domain. The voltage of the logic power rail can be scaled down (i.e., lowered) and/or collapsed during lower power modes below a minimum operating voltage needed for data retention in the memory domain. A power rail selection circuit is provided for providing power to the memory domain. However, the power rail selection circuit is configured to couple the memory domain to the logic power rail for supplying power to the memory arrays when the logic power rail can satisfy the minimum operating voltage of the memory domain. In this manner, as a non-limiting example, additional intrinsic decoupling capacitance of the memory arrays is coupled to the logic power rail during higher power modes of the logic power supply.

However, if the operating voltage of the logic power rail is below (e.g., scaled down) the minimum operating voltage of the memory domain, such as when the logic domain does not need higher performance operation, the power rail selection circuit is configured to couple the memory power rail to the memory domain to supply power to the memory domain at or above the minimum operating voltage of the memory domain. In this scenario, as an example, the logic domain may be operating in a reduced performance mode by the logic power supply supplying power below the minimum operating voltage of the memory domain, thereby reducing the need for coupling the additional intrinsic decoupling capacitance of the memory arrays to the logic power rail.

In this regard, in one exemplary aspect, a power rail selection circuit for a processor-based system is provided. The power rail selection circuit comprises a logic power input coupled to a logic power rail configured to receive logic power from a logic power supply configured to provide the logic power to a logic domain. The power rail selection circuit also comprises a memory power input coupled to a memory power rail configured to receive memory power from a memory power supply. The power rail selection circuit also comprises an array power output coupled to an array power rail coupled to at least one memory array in a memory domain. The power rail selection circuit also comprises a control circuit. The control circuit is configured to couple the logic power input to the array power output to couple the logic power rail to the array power rail, in response to an operating voltage at the logic power rail being at or above a minimum operating voltage of the memory domain. The control circuit is also configured to couple the memory power input to the array power output to couple the memory power rail to the array power rail, in response to the operating voltage at the logic power rail being below the minimum operating voltage of the memory domain.

In another exemplary aspect, a power rail selection circuit for a processor-based system is provided. The power rail selection circuit comprises means for coupling to a logic power rail configured to receive power from a logic power supply. The power rail selection circuit also comprises means for coupling to a memory power rail configured to receive power from a memory power supply. The power rail selection circuit also comprises means for coupling to an array power rail coupled to at least one memory array in a memory domain. The power rail selection circuit also comprises means for coupling the means for coupling to the logic power rail to the means for coupling to the array power rail configured to couple the logic power rail to the array power rail, in response to an operating voltage at the logic power rail being at or above a minimum operating voltage of the memory domain. The power rail selection circuit also comprises means for coupling the means for coupling to the memory power rail to the means for coupling to the array power rail configured to couple the memory power rail to the array power rail, in response to the operating voltage at the logic power rail being below the minimum operating voltage of the memory domain.

In another exemplary aspect, a method for selectively coupling a logic power rail and a memory power rail to an array power rail coupled to at least one memory array in a processor-based system, for coupling power from the logic power rail or the memory power rail to the at least one memory array is provided. The method comprises receiving logic power from a logic power supply over the logic power rail. The method also comprises receiving memory power from a memory power supply over the memory power rail. The method also comprises coupling the logic power rail to the array power rail coupled to the at least one memory array in a memory domain to provide the received logic power to the array power rail, in response to an operating voltage at the logic power rail being at or above a minimum operating voltage of the memory domain. The method also comprises coupling the memory power rail to the array power rail coupled to the at least one memory array in the memory domain to provide the received memory power to the array power rail, in response to the operating voltage at the logic power rail being below the minimum operating voltage of the memory domain.

In another exemplary aspect, a power rail control system for a processor-based system is provided. The power rail control system comprises a power rail control circuit. The power rail control circuit is configured to generate a memory power rail enable signal indicating a memory power rail enable state in response to an operating voltage at a logic power rail receiving logic power from a logic power supply and providing the received logic power to a logic domain, being below a minimum operating voltage of a memory domain. The power rail control circuit is also configured to generate a logic power rail enable signal, the logic power rail enable signal indicating a logic power rail enable state in response to the operating voltage at the logic power rail being at or above the minimum operating voltage of the memory domain. The power rail control system also comprises a power rail selection circuit. The power rail selection circuit is configured to couple the logic power rail receiving the logic power from the logic power supply to an array power rail coupled to at least one memory array in the memory domain to provide the logic power to the at least one memory array, in response to the logic power rail enable signal indicating the logic power rail enable state. The power rail selection circuit is also configured to couple a memory power rail receiving memory power from a memory power supply to the array power rail coupled to the at least one memory array in the memory domain to provide the memory power to the at least one memory array, in response to the memory power rail enable signal indicating the memory power rail enable state.

BRIEF DESCRIPTION OF THE FIGURES

FIG. 3 is a table illustrating exemplary power rail selections for providing power to a memory domain in the processor-based system in FIG. 2 based on a voltage level of the operating voltage at the logic power rail;

FIG. 6B is a table illustrating an exemplary sequence of the power rail selection circuit in FIG. 5 switching the array power rail coupled to the memory domain from the memory power rail to the logic power rail in a make-at-break scheme;

FIG. 8A is a table illustrating an exemplary sequence of the power rail selection circuit in FIG. 7 switching the array power rail coupled to the memory domain from the logic power rail to the memory power rail in a make-before-break scheme;

FIG. 10A is a table illustrating an exemplary sequence of the power rail selection circuit in FIG. 9 switching the array power rail coupled to the memory domain from the logic power rail to the memory power rail in a make-at-break scheme;

FIG. 10B is a table illustrating an exemplary sequence of the power rail selection circuit in FIG. 9 switching the array power rail coupled to the memory domain from the memory power rail to the logic power rail in a make-at-break scheme.

DETAILED DESCRIPTION

Figure 1:
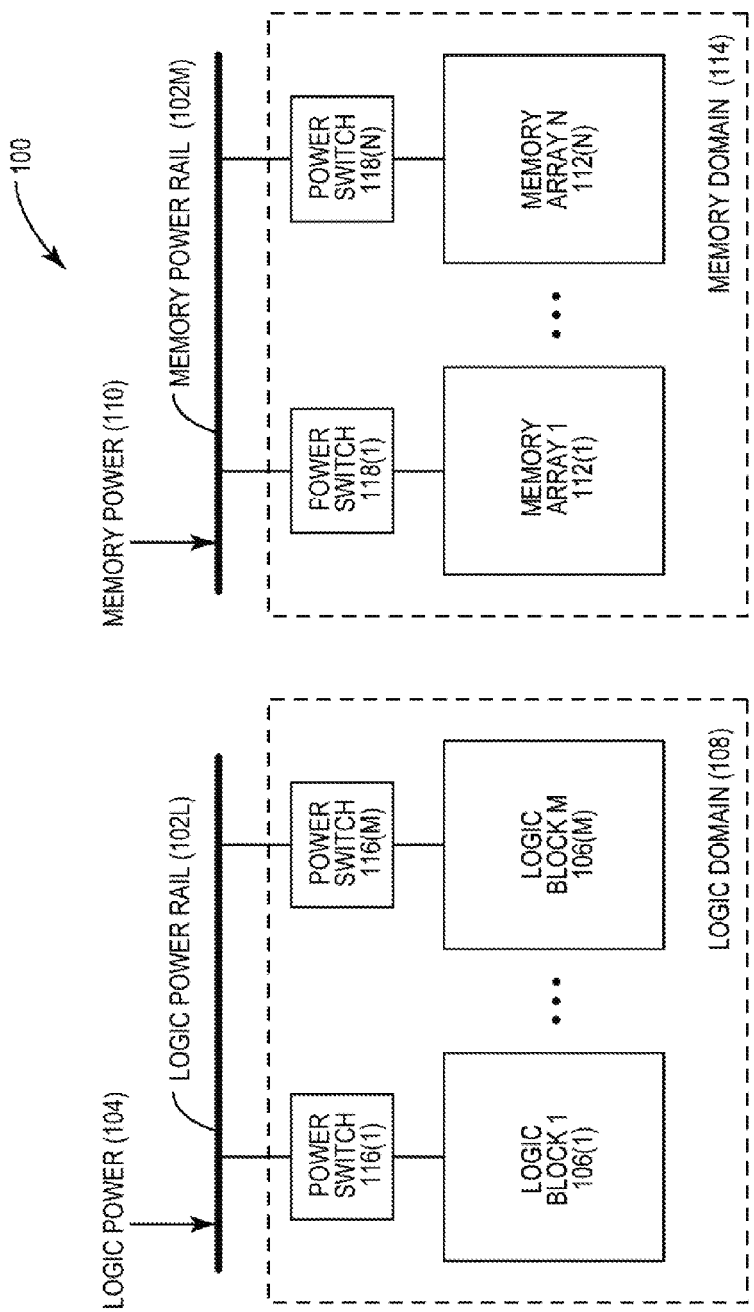
FIG. 1 is a block diagram of an exemplary processor-based system that includes multiple power rails for providing separate voltage domains for logic and memory domains.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Figure 2:
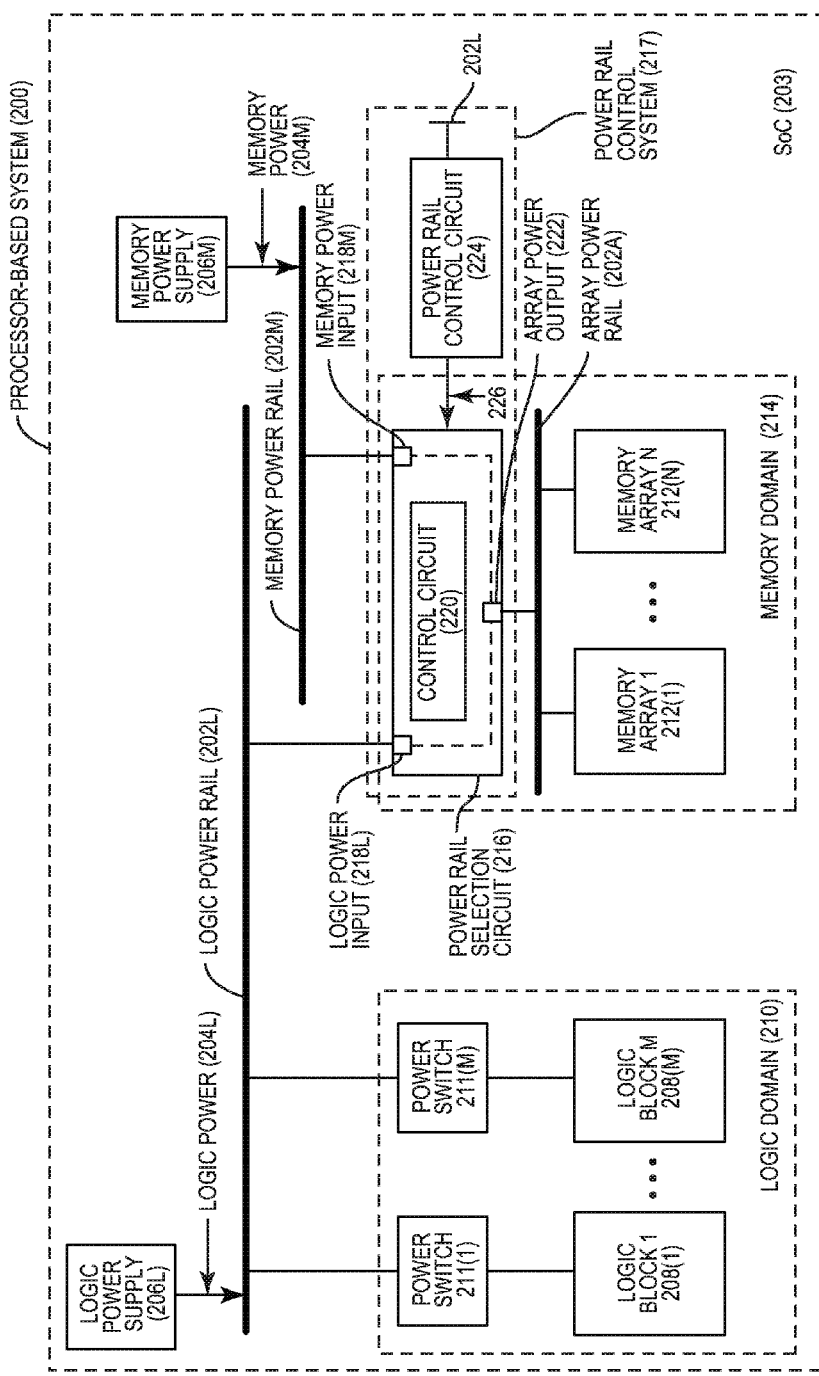
FIG. 2 is a block diagram of an exemplary processor-based system that includes multiple power rails for providing power to logic and memory domains, and a power rail selection circuit configured to select either a logic power rail or a memory power rail for providing power to a memory domain, in response to an operating voltage at the logic power rail being below, at, or above a minimum operating voltage of a memory domain, respectively.

FIG. 2 is block diagram of an exemplary processor-based system 200 that includes a logic power rail 202L and a separate memory power rail 202M. The processor-based system 200 may be provided in an integrated circuit (IC), including but not limited to a system-on-a-chip (SoC) 203. The logic power rail 202L is configured to receive logic power 204L from a logic power supply 206L. The memory power rail 202M is configured to receive memory power 204M from a memory power supply 206M separate from the logic power supply 206L. The logic power rail 202L is configured to provide the logic power 204L from the logic power supply 206L to one or more logic blocks 208(1)-208(M) in a logic domain 210, wherein 'M' can be any number of logic blocks 208. The logic blocks 208(1)-208(M) contain synchronous and/or asynchronous circuits that provide logic operations for the processor-based system 200. One or more power switches 211(1)-211(M) are provided to control the coupling of the logic power rail 202L to the logic blocks 208(1)-208(M) to provide the logic power 204L to the logic blocks 208(1)-208(M). The memory power rail 202M is configured to provide the memory power 204M from the memory power supply 206M to one or more memory arrays 212(1)-212(N) in a memory domain 214 separate from the logic power rail 202L and the logic power supply 206L. The memory power supply 206M is configured to provide a minimum operating voltage (e.g., 0.8 Volts (V)) in the memory power 204M sufficient for the memory arrays 212(1)-212(N) for memory operation functionality including data retention. Note that the minimum operating voltage for the memory arrays 212(1)-212(N) may be a higher voltage than the minimum voltage needed for data retention only (e.g., 0.6 V). In this manner, the logic power supply 206L can be scaled down (i.e., lowered) and/or collapsed during lower power modes of the processor-based system 200 below the minimum operating voltage needed for operation of the memory arrays 212(1)-212(N) in the memory domain 214, because the memory arrays 212(1)-212(N) are separately powered through the memory power rail 202M coupled to the separate memory power supply 206M. For example, the minimum operating voltage for the memory arrays 212(1)-212(N) may be 3.0 Volts (V), whereas a collapse in the logic power supply 206L may be a minimum voltage below 3.0 V, such as 1.0 V, or even 0.0 V.

It may be desired to couple the memory arrays 212(1)-212(N) in the memory domain 214 to the logic power rail 202L that is coupled to the logic domain 210 to avoid or reduce the need to provide intentional decoupling capacitance in the logic domain 210. This can mitigate or avoid voltage droops from occurring on the logic power rail 202L at the expense of additional area and leakage power. In this regard, with continuing reference to FIG. 2, a power rail selection circuit 216 is provided in a power rail control system 217 to control powering the memory arrays 212(1)-212(N) in the memory domain 214. The power rail selection circuit 216 is coupled to both the logic power rail 202L and the memory power rail 202M through a logic power input 218L and a memory power input 218M. The power rail selection circuit 216 includes a control circuit 220 that is configured to couple the memory domain 214 through an array power output 222 to either the logic power rail 202L or the memory power rail 202M. For example, when the logic power supply 206L provides the logic power 204L on the logic power rail 202L at a voltage at or above the minimum operating voltage of the memory arrays 212(1)-212(N) during higher logic power modes, the control circuit 220 in the power rail selection circuit 216 is configured to couple the logic power input 218L to the array power output 222 to couple the logic power rail 202L to the memory arrays 212(1)-212(N) in response. In this example, a power rail control circuit 224 is also provided in the power rail control system 217 and coupled to the logic power rail 202L to determine when the voltage of the logic power 204L falls below the minimum operating voltage for memory operation functionality (e.g., read and write operations) in the memory domain 214. The power rail control circuit 224 is configured to provide a power rail signal 226 to the control circuit 220 indicating that the voltage of the logic power 204L is at or above the minimum operating voltage of the memory domain 214. This causes the control circuit 220 to couple the logic power input 218L to the array power output 222 when the logic power 204L on the logic power rail 202L is at a voltage at or above the minimum operating voltage of the memory arrays 212(1)-212(N). In this manner, the memory arrays 212(1)-212(N) are powered by the logic power 204L on the logic power rail 202L. In this instance, the additional intrinsic decoupling capacitance of the memory arrays 212(1)-212(N) is coupled to the logic power rail 202L. Coupling the intrinsic decoupling capacitance of the memory arrays 212(1)-212(N) to the logic power rail 202L can assist in mitigating or avoiding voltage droops from occurring on the logic power rail 202L. This can prevent the need to add additional intentional decoupling capacitance in the logic domain 210 to allow the logic power supply 206L supplying the logic power 204L to the logic power rail 202L to operate with a lower power supply voltage margin.

However, the operating voltage of the logic power 204L provided by the logic power supply 206L to the logic power rail 202L may be lowered or scaled down below the minimum operating voltage of the memory arrays 212(1)-212(N) needed for memory operation functionality, such as when the logic domain 210 does not require higher performance. In this regard, in response, the control circuit 220 of the power rail selection circuit 216 is configured to instead couple the memory arrays 212(1)-212(N) in the memory domain 214 to the memory power rail 202M for supplying the memory power 204M to the memory arrays 212(1)-212(N). The control circuit 220 receives the power rail signal 226 indicating that the voltage of the logic power 204L is below the minimum operating voltage of the memory domain 214. In response, the power rail selection circuit 216 couples the memory power input 218M to the array power output 222 to couple the memory power rail 202M to an array power rail 202A. In this manner, the memory arrays 212(1)-212(N) are powered by the memory power 204M provided by the memory power supply 206M during lower performance modes of the logic domain 210 when the operating voltage of the logic power 204L is below the minimum operating voltage needed for memory operation functionality in the memory arrays 212(1)-212(N). When the logic domain 210 is operating in a reduced performance mode, the power delivery voltage margin of the logic power supply 206L is reduced, thereby reducing the need for coupling the additional intrinsic decoupling capacitance to the logic power rail 202L to mitigate or avoid voltage droops from occurring on the logic power rail 202L.

With continuing reference to FIG. 2, note that in response to the control circuit 220 receiving the power rail signal 226 indicating that the voltage of the logic power 204L is at or above the minimum operating voltage of the memory domain 214, the power rail selection circuit 216 is also configured to decouple the memory power input 218M from the array power output 222 to decouple the memory power rail 202M from the array power rail 202A. In this manner, the power rail selection circuit 216 provides for the memory domain 214 to not be powered by the memory power 204M from the memory power supply 206M when the logic power supply 206L supplies the logic power 204L at or above the minimum operating voltage of the memory domain 214. Likewise, in response to the control circuit 220 receiving the power rail signal 226 indicating that the voltage of the logic power 204L is below the minimum operating voltage of the memory domain 214, the power rail selection circuit 216 is also configured to decouple the logic power input 218L from the array power output 222 to decouple the logic power rail 202L from the array power rail 202A. In this manner, the power rail selection circuit 216 provides for the memory domain 214 to not be powered by the logic power 204L from the logic power supply 206L when the logic power supply 206L supplies the logic power 204L below the minimum operating voltage of the memory domain 214.

In summary, by coupling the memory arrays 212(1)-212(N) in the memory domain 214 to the logic power rail 202L when the logic power 204L is at or above the minimum operating voltage of the memory arrays 212(1)-212(N), such as in a higher logic performance mode, the power delivery voltage margin of the logic power rail 202L is reduced. The memory power supply 206M is only required to provide power to the memory power rail 202M sufficient to power the memory arrays 212(1)-212(N) when the logic power 204L is below the minimum operating voltage of the memory arrays 212(1)-212(N), such as in a lower logic performance mode, thereby reducing the range needed by the memory power supply 206M. This could lead to a cost reduction of the memory power supply 206M and the memory power rail 202M design and implementation.

FIG. 3 is a table 300 illustrating exemplary power rail selections provided by the power rail selection circuit 216 in the processor-based system 200 in FIG. 2 for providing power to the memory domain 214 based on the voltage level of the logic power 204L provided to the logic power rail 202L. In this regard, the table 300 in FIG. 3 assumes that the minimum operating voltage for memory operation functionality in the memory domain 214 is 0.8 Volts (V). Thus, as shown in the table 300, when the voltage level of the logic power 204L at the logic power rail 202L is at 0.8 V or above in this example, the power rail control circuit 224 provides the power rail signal 226 to the power rail selection circuit 216 to indicate that the voltage level of the logic power 204L at the logic power rail 202L is at or above the minimum operating voltage of the memory domain 214. In response, the power rail selection circuit 216 couples the memory domain 214 to the logic power rail 202L to provide the logic power 204L from the logic power supply 206L on the logic power rail 202L to the memory arrays 212(1)-212(N). However, when the operating voltage of the logic power 204L on the logic power rail 202L drops below 0.8 V in this example, the power rail control circuit 224 provides the power rail signal 226 to the power rail selection circuit 216 to indicate that the voltage level of the logic power 204L at the logic power rail 202L is below the minimum operating voltage of the memory domain 214. In response, the power rail selection circuit 216 couples the memory domain 214 to the memory power rail 202M to provide the memory power 204M of the memory power supply 206M to the memory arrays 212(1)-212(N) for operation.

Figure 4:
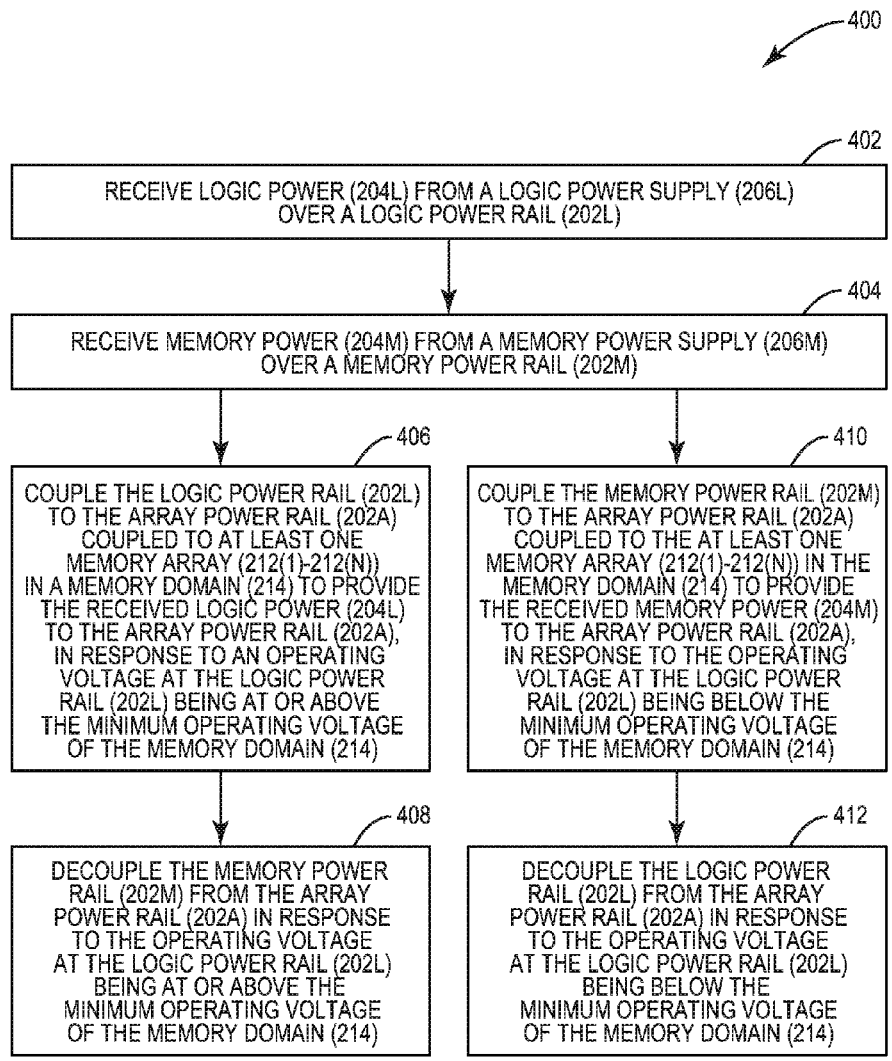
FIG. 4 is a flowchart illustrating an exemplary process of the power rail selection circuit in the processor-based system in FIG. 2 selecting either the logic power rail or the memory power rail for providing power to the memory domain, in response to the operating voltage at the logic power rail being below, at, or above the minimum operating voltage of the memory domain, respectively.

FIG. 4 is a flowchart illustrating an exemplary process 400 of the power rail selection circuit 216 in the processor-based system 200 of FIG. 2 selecting to couple either the logic power rail 202L or the memory power rail 202M to the memory domain 214, based on the operating voltage of the logic power 204L at the logic power rail 202L. In this regard, the logic power 204L is received from the logic power supply 206L over the logic power rail 202L (block 402). The memory power 204M is received from the memory power supply 206M over the memory power rail 202M (block 404). In response to the operating voltage of the logic power 204L at the logic power rail 202L being at or above the minimum operating voltage of the memory domain 214, the power rail selection circuit 216 is configured to couple the logic power rail 202L to the array power rail 202A to power the memory domain 214 from the logic power 204L (block 406). The power rail selection circuit 216 is also configured to decouple the memory power rail 202M from the array power rail 202A in response to the operating voltage of the logic power 204L at the logic power rail 202L being at or above the minimum operating voltage of the memory domain 214 (block 408). However, in response to the operating voltage of the logic power 204L at the logic power rail 202L being below the minimum operating voltage of the memory domain 214, the power rail selection circuit 216 is configured to couple the memory power rail 202M to the array power rail 202A to power the memory domain 214 from the memory power 204M (block 410). The power rail selection circuit 216 is also configured to decouple the logic power rail 202L from the array power rail 202A in response to the operating voltage of the logic power 204L at the logic power rail 202L being below the minimum operating voltage of the memory domain 214 (block 412).

Figure 5:
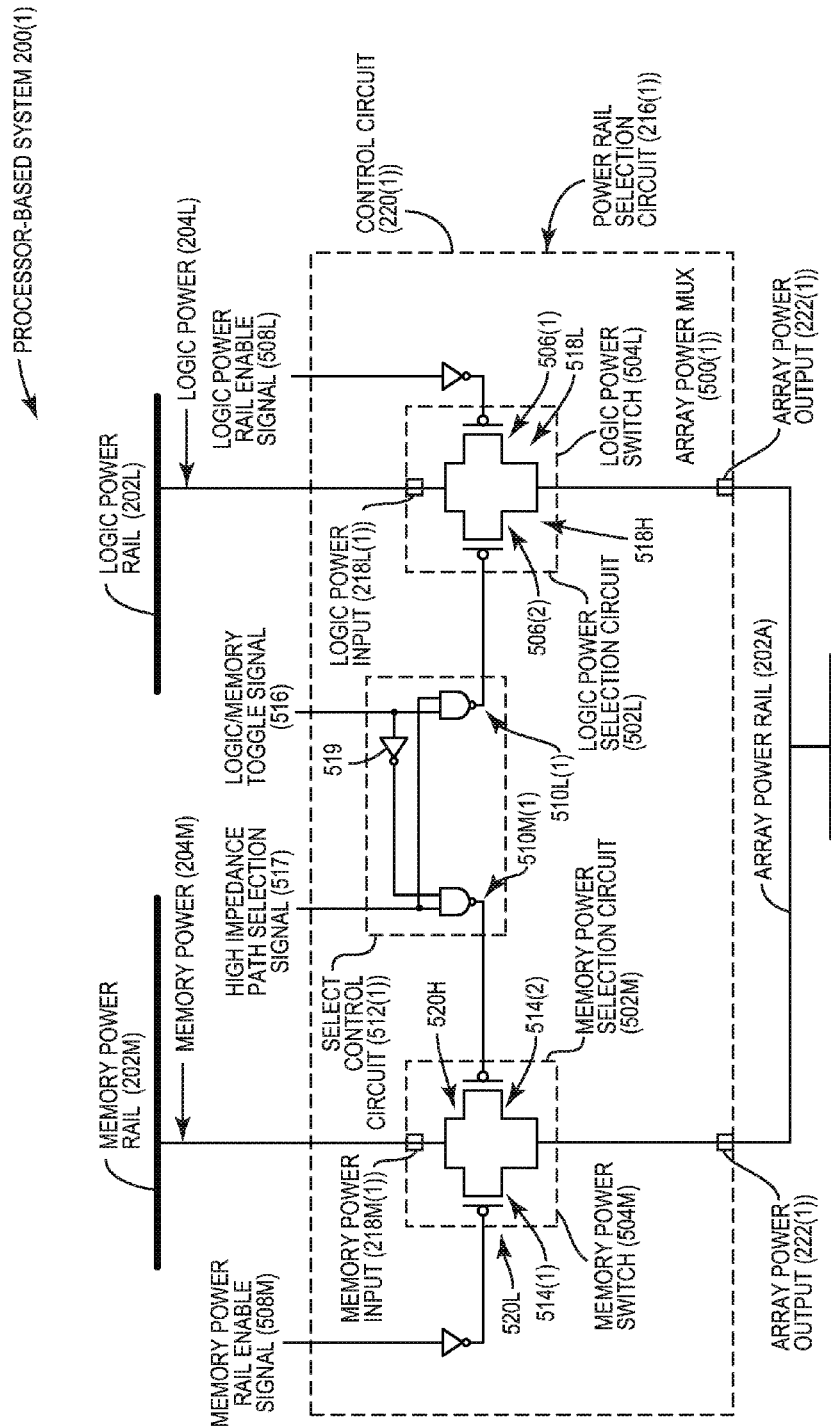
FIG. 5 is a schematic diagram of an exemplary power rail selection circuit that can be provided in the processor-based system in FIG. 2 for selecting either the logic power rail or the memory power rail to be coupled to the memory domain in a make-at-break scheme.

The power rail selection circuit 216 in the processor-based system 200 in FIG. 2 can be implemented in different exemplary ways with different implementation details. For example, FIG. 5 is a schematic diagram of an exemplary power rail selection circuit 216(1) provided in a processor-based system 200(1). Common elements between the processor-based system 200 in FIG. 2 and the processor-based system 200(1) in FIG. 5 are shown with common elements numbers, and thus will not be re-described. In this example, as will be discussed below, the power rail selection circuit 216(1) is configured to operate as a make-at-break system, meaning that the power rail selection circuit 216(1) is configured to couple the logic power rail 202L or the memory power rail 202M to the array power rail 202A simultaneously (i.e., at the same time or substantially the same time) as the memory power rail 202M or the logic power rail 202L, respectively, is decoupled from the array power rail 202A. In this manner, the memory arrays 212(1)-212(N) in the memory domain 214 are powered by either the logic power 204L from the logic power rail 202L or the memory power 204M from the memory power rail 202M, as discussed above.

In this regard, a control circuit 220(1) is provided in the power rail selection circuit 216(1) in the form of an array power multiplexor (mux) 500(1) that includes a logic power selection circuit 502L and a memory power selection circuit 502M. The logic power selection circuit 502L is controlled to selectively couple the logic power rail 202L to the array power rail 202A to provide the logic power 204L to the memory arrays 212(1)-212(N) in the memory domain 214. The memory power selection circuit 502M is controlled to selectively couple the memory power rail 202M to the array power rail 202A to provide the memory power 204M to the memory arrays 212(1)-212(N) in the memory domain 214. In this example, as discussed in more detail below, the logic power selection circuit 502L is provided in the form of a logic power switch 504L that is configured to be controlled to selectively couple the logic power rail 202L to the array power rail 202A. Also in this example, the memory power selection circuit 502M is provided in the form of a memory power switch 504M configured to be controlled to selectively couple the memory power rail 202M to the array power rail 202A.

With continuing reference to FIG. 5, the logic power switch 504L in this example is comprised of a first and second logic power transistor 506(1), 506(2) provided in the form of P-type Field-Effect Transistors (PFETs) in this example (hereinafter PFETs 506(1), 506(2)). The PFETs 506(1), 506(2) are configured in a pass gate arrangement in this example. The PFET 506(1) is controlled by a logic power rail enable signal 508L to couple the logic power rail 202L coupled to a logic power input 218L(1), to the array power rail 202A coupled to an array power output 222(1) in a lower first logic power impedance path 518L. The PFET 506(2), which may be sized much smaller than the PFET 506(1) (e.g., 100 times smaller), is controlled by a logic make signal 510L(1) from a select control circuit 512(1), to couple the logic power rail 202L to the array power rail 202A in a second logic power impedance path 518H. Providing the second logic power impedance path 518H allows the logic power rail enable signal 508L to provide power from the logic power rail 202L to the memory arrays 212(1)-212(N) sufficient for data retention during the power rail transition when the array power rail 202A is decoupled from the logic power rail 202L through the first logic power impedance path 518L. The smaller PFET 506(2) provides for the second logic power impedance path 518H from the logic power rail 202L to the array power rail 202A to be of a higher impedance than the first logic power impedance path 518L provided by the PFET 506(1) to reduce current draw. This avoids or limits cross-conduction current that could flow from the logic power rail 202L to the memory power rail 202M, or vice versa. The memory arrays 212(1)-212(N) can be controlled to be prevented from performing memory operations during the transition of switching coupling of the logic power rail 202L and the memory power rail 202M, when the second logic power impedance path 518H couples the logic power rail 202L to the array power rail 202A with a reduced current for data retention.

Similarly, the memory power switch 504M in this example is also comprised of a first and second memory power transistor 514(1), 514(2) provided in the form of PFETs in this example (hereinafter PFETs 514(1), 514(2)). The PFETs 514(1), 514(2) are configured in a pass gate arrangement in this example. The PFET 514(1) is controlled by a memory power rail enable signal 508M to couple the memory power rail 202M coupled to a memory power input 218M(1), to the array power rail 202A coupled to an array power output 222(1), through a lower first memory power impedance path 520L. The PFET 514(2), which may be sized much smaller than the PFET 514(1) (e.g., 100 times smaller), is controlled by a memory make signal 510M(1) from a select control circuit 512(1), to couple the memory power rail 202M to the array power rail 202A in a second memory power impedance path 520H. Providing the second memory power impedance path 520H allows the memory power rail 202M to provide power from the logic power rail 202L to the memory arrays 212(1)-212(N) sufficient for data retention during the power rail transition when the array power rail 202A is decoupled from the memory power rail 202M through the first memory power impedance path 520L. The smaller PFET 514(2) provides for the second memory power impedance path 520H from the memory power rail 202M to the array power rail 202A to be of a higher impedance than the first memory power impedance path 520L provided by the PFET 514(1) to reduce current draw. This avoids or limits cross-conduction current that could flow from the memory power rail 202M to the logic power rail 202L, or vice versa. The memory arrays 212(1)-212(N) can be controlled to be prevented from performing memory operations during the transition of switching coupling of the memory power rail 202M and the logic power rail 202L when the second memory power impedance path 520H couples the memory power rail 202M to the array power rail 202A with a reduced current for data retention.

With continuing reference to FIG. 5, the select control circuit 512(1) is configured to generate the logic make signal 510L(1) and the memory make signal 510M(1) to control enabling the PFETs 506(2), 514(2) to control the logic power rail 202L and the memory power rail 202M, respectively, being coupled to the array power rail 202A through the second logic power impedance path 518H and the second memory power impedance path 520H, respectively. The select control circuit 512(1) is configured to generate a logic make signal 510L(1) and the memory make signal 510M(1) based on a logic/memory toggle signal 516 and a high impedance path selection signal 517, respectively. The logic/memory toggle signal 516 controls whether the memory power rail 202M or the logic power rail 202L is selected to be coupled through the second memory power impedance path 520H or the second logic power impedance path 518H, respectively. The high impedance path selection signal 517 controls the enabling and disabling of the PFETs 506(2), 514(2) to allow the selected memory power rail 202M or logic power rail 202L to be coupled through the respective second logic power impedance path 518H or the second memory power impedance path 520H, respectively, to the array power rail 202A. Thus, by controlling the logic/memory toggle signal 516 and the high impedance path selection signal 517, a make-at-break scheme in this example can be implemented. In a make-at-break scheme, the second memory power impedance path 520H is broken (i.e., the PFET 514(2) is turned off) at the same time or substantially the same time as the second logic power impedance path 518H is made (i.e., the PFET 506(2) is turned on), and vice versa, to connect and disconnect coupling of the logic power rail 202L and the memory power rail 202M through their respective second logic power impedance path 518H and second memory power impedance path 520H, respectively.

Figure 6A:
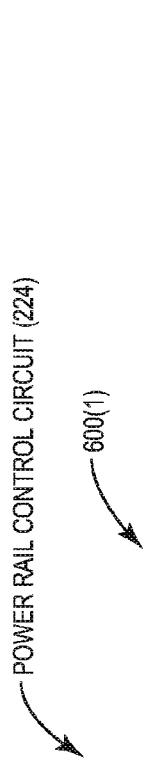
FIG. 6A is a table illustrating an exemplary sequence of the power rail selection circuit in FIG. 5 switching the array power rail coupled to the memory domain from the logic power rail to the memory power rail in a make-at-break scheme.

To further illustrate the make-at-break operation of the power rail selection circuit 216(1) in FIG. 5, tables 600(1) and 600(2) in FIGS. 6A and 6B are provided. FIG. 6A illustrates the table 600(1) illustrating an exemplary sequence of the power rail selection circuit 216(1) in FIG. 5 switching the power rail coupled to the array power rail 202A from the logic power rail 202L to the memory power rail 202M in a make-at-break scheme. In this regard, when it is determined that the memory arrays 212(1)-212(N) should be coupled to the memory power rail 202M when the voltage of the logic power 204L is below the minimum operating voltage of the memory arrays 212(1)-212(N), the logic power rail 202L is coupled to the array power rail 202A. As shown in state entry 602(1) in FIG. 6A, the logic power rail enable signal 508L is already a logic '1' value such that the PFET 506(1) is turned on to couple the logic power rail 202L to the array power rail 202A through the first logic power impedance path 518L. The memory power rail enable signal 508M is already a logic '0' such that the PFET 514(1) is turned off to decouple the memory power rail 202M from the array power rail 202A through the first memory power impedance path 520L. The logic/memory toggle signal 516 and the high impedance path selection signal 517 are logic '1' values such that the select control circuit 512(1) turns on the PFET 506(2) to couple the logic power rail 202L to the array power rail 202A through the second logic power impedance path 518H.

Thereafter, to switch coupling of the array power rail 202A to the memory power rail 202M, the logic power rail enable signal 508L is received indicating a logic power rail disable state. For example, the logic power rail enable signal 508L is generated by the power rail control circuit 224 (see FIG. 2). In this example, as shown in state entry 602(2) in FIG. 6A, the logic power rail enable signal 508L receives a logic '0' value to turn off the PFET 506(1) in the logic power switch 504L, thereby breaking the first logic power impedance path 518L between the logic power rail 202L and the array power rail 202A. In this example, the received logic/memory toggle signal 516 from the power rail control circuit 224 remains a logical '1' value to generate the logic make signal 510L(1) to keep the PFET 506(2) turned on while the PFET 506(1) is turned off so that a minimum voltage from the memory power rail 202M is provided to the array power rail 202A for data retention in the memory arrays 212(1)-212(N).

Then, as shown in state entry 602(3) in FIG. 6A, the logic/memory toggle signal 516 is controlled to be a logic '0' value to cause the select control circuit 512(1) to select the second memory power impedance path 520H by turning on the PFET 514(2) while simultaneously turning off the PFET 506(2) in the second logic power impedance path 518H. The high impedance path selection signal 517 remains a logic '1' value to enable turning on of the PFET 514(2) in the second memory power impedance path 520H as shown in state entry 602(3) in FIG. 6A to couple the memory power rail 202M to the array power rail 202A through the second memory power impedance path 520H. This is a make-at-break scheme in this example, because the array power rail 202A switches from being coupled from the logic power rail 202L to the memory power rail 202M at the same time or substantially the same time based on the switching of the logic state of the logic/memory toggle signal 516.

The array power rail 202A is then allowed to ramp-up to the voltage of the memory power rail 202M as shown in state entry 602(4) in FIG. 6A. The memory power rail enable signal 508M is then controlled to turn on the PFET 514(1) to additionally couple the memory power rail 202M through the first memory power impedance path 520L to the array power rail 202A, as shown in state entry 602(5) in FIG. 6A. Cross-conduction current is avoided, because the logic power rail 202L is fully decoupled from the array power rail 202A by the switching of the logic/memory toggle signal 516 to turn off the PFET 506(2) in the second logic power impedance path 518H before the PFET 514(1) is turned on to couple the memory power rail 202M to the array power rail 202A through the first memory power impedance path 520L.

Note that the transition from coupling the memory power rail 202M to the array power rail 202A to coupling the logic power rail 202L to the array power rail 202A, in the power rail selection circuit 216(1) in FIG. 5 can be controlled by the power rail control circuit 224 to occur in opposite order of the order discussed above in this example. This is shown in state entries 604(1)-604(5) in the table 600(2) in FIG. 6B. The logic power rail enable signal 508L and memory power rail enable signal 508M are controlled by the power rail control circuit 224 in FIG. 2 to indicate a logic power rail enable state and a memory power rail enable state, respectively, to switch the coupling of the array power rail 202A from the memory power rail 202M to the logic power rail 202L. Thus, there is no need to specifically re-describe this transition.

Note that the power rail selection circuit 216(1) can also be configured to couple the logic power rail 202L or the memory power rail 202M to the array power rail 202A in a make-before-break scheme, as another example. In other words, the power rail selection circuit 216(1) can also be configured to couple the logic power rail 202L or the memory power rail 202M to the array power rail 202A before the respective memory power rail 202M or the logic power rail 202L, is decoupled from the array power rail 202A in a make-before-break scenario.

Figure 7:
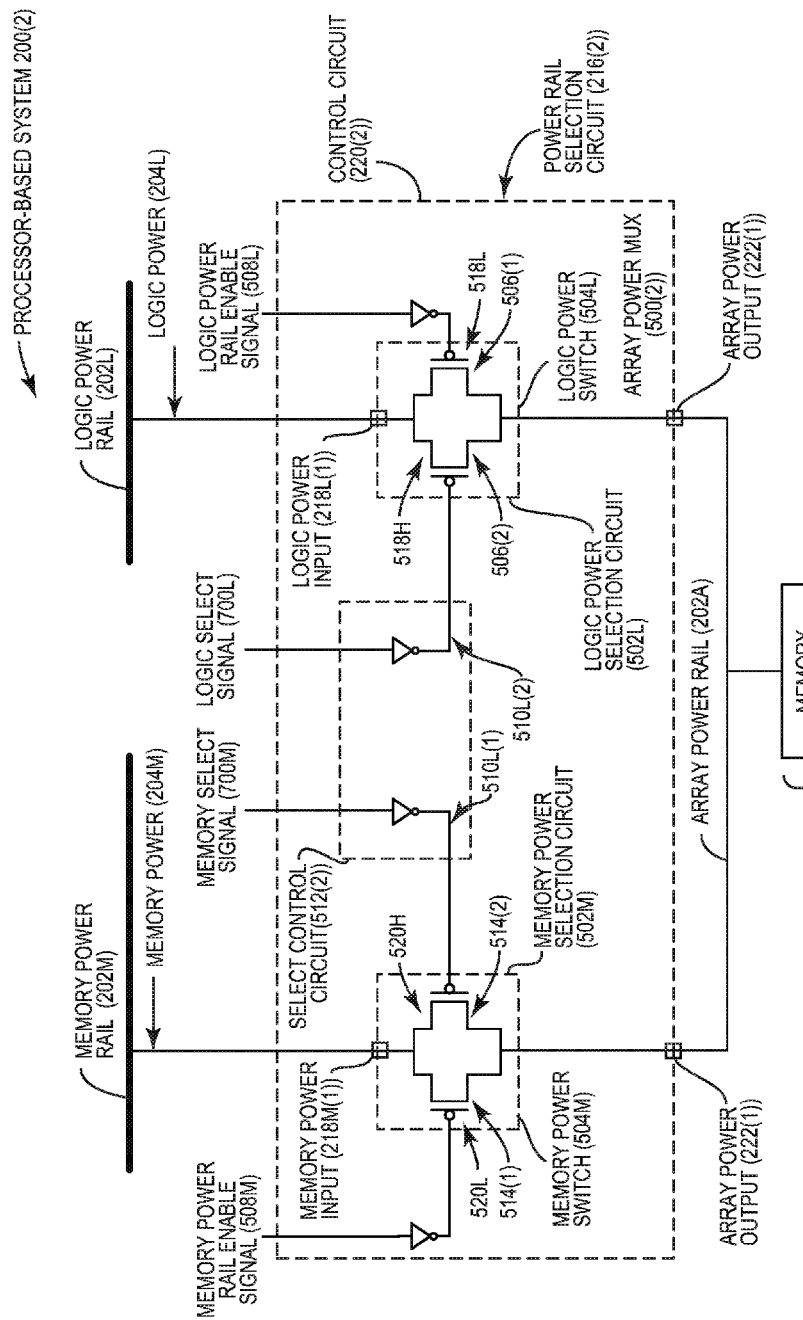
FIG. 7 is a schematic diagram of another exemplary power rail selection circuit that can be provided in the processor-based system in FIG. 2 for selecting either the logic power rail or the memory power rail to be coupled to the memory domain in a make-before-break scheme.

In this regard, FIG. 7 illustrates an alternative exemplary power rail selection circuit 216(2) that employs a make-before-break scheme and that can be provided in a processor-based system 200(2). Common elements between the processor-based system 200 in FIG. 2, the processor-based system 200(1) in FIG. 5, and the processor-based system 200(2) in FIG. 7 are shown with common elements numbers, and thus will not be re-described. In this example, as will be discussed below, the power rail selection circuit 216(2) is configured to operate as a make-before-break system, meaning that the power rail selection circuit 216(2) is configured to couple the logic power rail 202L or the memory power rail 202M to the array power rail 202A before the memory power rail 202M or the logic power rail 202L, respectively, is decoupled from the array power rail 202A. In this manner, the memory arrays 212(1)-212(N) in the memory domain 214 are powered by either the logic power 204L from the logic power rail 202L or the memory power 204M from the memory power rail 202M, as discussed above.

In this regard, a control circuit 220(2) in the power rail selection circuit 216(2) is provided in the form of an array power mux 500(2). The control circuit 220(2) includes the logic power selection circuit 502L and the memory power selection circuit 502M previously described with regard to the control circuit 220(1) in FIG. 5.

Figure 8B:
FIG. 8B is a table illustrating an exemplary sequence of the power rail selection circuit in FIG. 7 switching the array power rail coupled to the memory domain from the memory power rail to the logic power rail in a make-before-break scheme.

To further illustrate the make-before-break operation of the power rail selection circuit 216(2) in FIG. 7, tables 800(1), 800(2) in FIGS. 8A and 8B are provided. FIG. 8A illustrates the table 800(1) illustrating an exemplary sequence of the power rail selection circuit 216(2) in FIG. 7 switching the power rail coupled to the array power rail 202A from the logic power rail 202L to the memory power rail 202M in a make-before-break scheme. In this regard, when it is determined that the memory arrays 212(1)-212(N) should be coupled to the memory power rail 202M when the voltage of the logic power 204L is below the minimum operating voltage of the memory arrays 212(1)-212(N), the logic power rail 202L is coupled to the array power rail 202A. As shown in state entry 802(1) in FIG. 8A, the logic power rail enable signal 508L is already a logic '1' value such that the PFET 506(1) is turned on to couple the logic power rail 202L to the array power rail 202A through the first logic power impedance path 518L. The memory power rail enable signal 508M is already a logic '0' such that the PFET 514(1) is turned off to decouple the memory power rail 202M to the array power rail 202A through the first memory power impedance path 520L. A logic select signal 700L is a logic '1' value such that the select control circuit 512(2) turns on the PFET 506(2) to couple the logic power rail 202L to the array power rail 202A through the second logic power impedance path 518H.

Thereafter, to switch coupling of the array power rail 202A to the memory power rail 202M, the logic power rail enable signal 508L is received indicating a logic power rail disable state. For example, the logic power rail enable signal 508L is generated by the power rail control circuit 224 (see FIG. 2). In this example, as shown in state entry 802(2) in FIG. 8A, the logic power rail enable signal 508L is a logic '0' value to turn off the PFET 506(1) in the logic power switch 504L, thereby breaking the first logic power impedance path 518L between the logic power rail 202L and the array power rail 202A. In this example, the logic select signal 700L from the power rail control circuit 224 remains a logical '1' value to generate the logic make signal 510L(2) to keep the PFET 506(2) turned on while the PFET 506(1) is turned off so that a minimum voltage from the logic power rail 202L is provided to the array power rail 202A for data retention in the memory arrays 212(1)-212(N).

Then, as shown in state entry 802(3) in FIG. 8A, a memory select signal 700M is controlled to be a logic '1' value to cause the select control circuit 512(2) to turn on the PFET 514(2) in the second memory power impedance path 520H. In this manner, the memory power rail 202M is coupled to the array power rail 202A through the second memory power impedance path 520H while the array power rail 202A is also coupled to the logic power rail 202L through the second logic power impedance path 518H. This is a make-before-break scheme in this example, because the array power rail 202A is coupled to the memory power rail 202M before the array power rail 202A is decoupled from the logic power rail 202L. The logic select signal 700L can then be controlled to turn off the PFET 506(2) to decouple the array power rail 202A from the logic power rail 202L, as shown in state entry 802(4) in FIG. 8A. The array power rail 202A is also allowed to ramp-up to the voltage of the memory power rail 202M as shown in state entry 802(4) in FIG. 8A. The memory power rail enable signal 508M is then controlled to turn on the PFET 514(1) to additionally couple the memory power rail 202M through the first memory power impedance path 520L to the array power rail 202A, as shown in state entry 802(5) in FIG. 8A. Cross-conduction current is limited, because the logic power rail 202L is fully decoupled form the array power rail 202A by the switching of the logic/memory toggle signal 516 to turn off the PFET 506(2) in the second logic power impedance path 518H before the PFET 514(1) is turned on to couple the memory power rail 202M to the array power rail 202A through the first memory power impedance path 520L. In this case, some cross-conduction current flows, due to both the second logic power impedance path 518H and the second memory power impedance path 520H being activated at the same time.

Note that the transition from coupling the memory power rail 202M to the array power rail 202A to coupling the logic power rail 202L to the array power rail 202A, in the power rail selection circuit 216(2) in FIG. 7 can be controlled by the power rail control circuit 224 to occur in opposite order of the order discussed above in this example. This is shown in the state entries 804(1)-804(5) in the table 800(2) in FIG. 8B. The logic power rail enable signal 508L and the memory power rail enable signal 508M are controlled by the power rail control circuit 224 in FIG. 2 to indicate a logic power rail enable state and a memory power rail enable state, respectively, to switch the coupling of the array power rail 202A from the memory power rail 202M to the logic power rail 202L. Thus, there is no need to specifically re-describe this transition.

Figure 9:
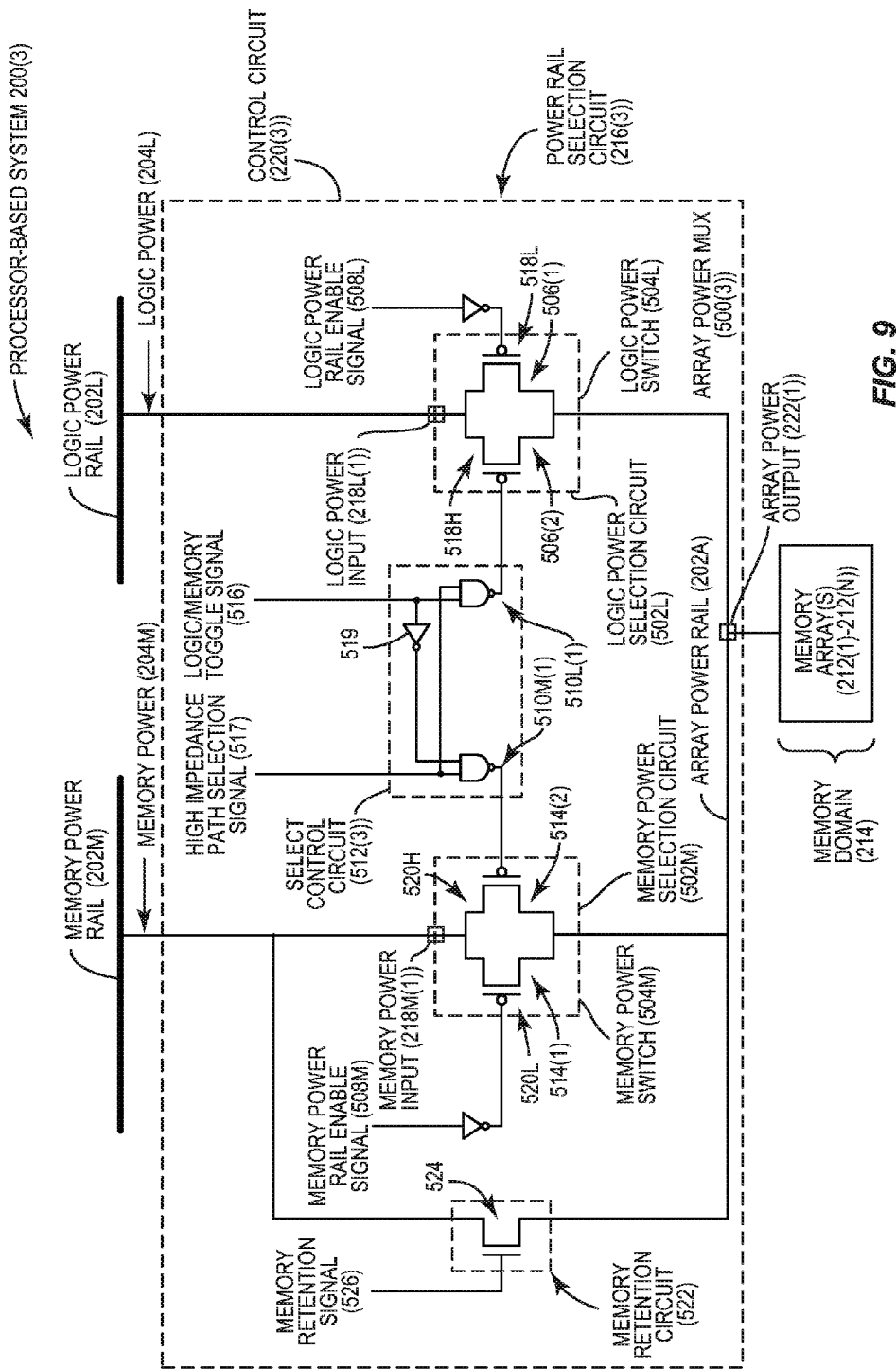
FIG. 9 is a schematic diagram of another exemplary power rail selection circuit that can be provided in the processor-based system in FIG. 2 provided in the form of an array power multiplexor for selecting either the logic power rail or the memory power rail for providing power to the memory domain in a make-at-break scheme.

FIG. 9 is a schematic diagram of yet another alternative power rail selection circuit 216(3) that can be provided in a processor-based system 200(3) for selecting either the logic power rail 202L or the memory power rail 202M to be coupled to the memory domain 214. Common elements between the processor-based system 200(1) in FIG. 5, and the processor-based system 200(3) in FIG. 9 are shown with common element numbers, and thus will not be re-described. In this example, the power rail selection circuit 216(3) is similar to the power rail selection circuit 216(1) in FIG. 5. The power rail selection circuit 216(3) is configured to operate as a make-at-break system, meaning that the power rail selection circuit 216(3) is configured to switch the coupling of the logic power rail 202L or the memory power rail 202M to the array power rail 202A at the same time or substantially the same time as the memory power rail 202M or the logic power rail 202L, respectively, is decoupled from the array power rail 202A.

However, as shown in FIG. 9, the power rail selection circuit 216(3) additionally includes a memory retention circuit 522. The memory retention circuit 522 is provided in the form of an N-type FET (NFET) 524 in this example. The NFET 524 is configured to selectively couple the memory power rail 202M to the array power rail 202A in addition to the coupling paths provided by the logic and memory power switches 504L, 504M described above with regard to FIG. 5A. A memory retention signal 526 is controlled to activate (i.e., turn on) and deactivate (i.e., turn off) the NFET 524. When the memory retention signal 526 is a logic '1' value to turn on the NFET 524, this allows the NFET 524 to behave in a diode-drop mode when a voltage on the array power rail 202A is lower than the voltage of the memory power rail 202M by the threshold voltage of the NFET 524 to reduce cross-conduction current between the logic and memory power rails 202L, 202M. The memory retention signal 526 is controlled to indicate an enable state in a diode-drop mode when it is desired that the memory power rail 202M is to be coupled to the array power rail 202A through the NFET 524.

To further illustrate the make-at-break operation of the power rail selection circuit 216(3) in FIG. 9, tables 1000(1) and 1000(2) in FIGS. 10A and 10B are provided. FIG. 10A illustrates the table 1000(1) illustrating an exemplary sequence of the power rail selection circuit 216(3) in FIG. 9 switching the power rail coupled to the array power rail 202A from the logic power rail 202L to the memory power rail 202M in a make-at-break scheme. In this regard, when it is determined that the memory arrays 212(1)-212(N) should be coupled to the memory power rail 202M when the voltage of the logic power 204L is below the minimum operating voltage of the memory arrays 212(1)-212(N), the logic power rail 202L is coupled to the array power rail 202A. As shown in state entry 1002(1) in FIG. 10A, the logic power rail enable signal 508L is already a logic '1' value such that the PFET 506(1) is turned on to couple the logic power rail 202L to the array power rail 202A through the first logic power impedance path 518L. The memory power rail enable signal 508M is already a logic '0' such that the PFET 514(1) is turned off to decouple the memory power rail 202M from the array power rail 202A through the first memory power impedance path 520L. The logic/memory toggle signal 516 and the high impedance path selection signal 517 are logic '1' values such that the select control circuit 512(3) turns on the PFET 506(2) to couple the logic power rail 202L to the array power rail 202A through the second logic power impedance path 518H. The memory retention signal 526 is logic '0' to turn off the NFET 524.

Thereafter, to switch coupling of the array power rail 202A to the memory power rail 202M, the logic power rail enable signal 508L is received indicating a logic power rail disable state (i.e., logic '0' in this example). For example, the logic power rail enable signal 508L is generated by the power rail control circuit 224 (see FIG. 2). In this example, as shown in state entry 1002(2) in FIG. 10A, the logic power rail enable signal 508L receives a logic '0' value to turn off the PFET 506(1) in the logic power switch 504L, thereby breaking the first logic power impedance path 518L between the logic power rail 202L and the array power rail 202A. In this example, the received logic/memory toggle signal 516 from the power rail control circuit 224 remains a logical '1' value to generate the logic make signal 510L(1) to keep the PFET 506(2) turned on while the PFET 506(1) is turned off so that a minimum voltage from the memory power rail 202M is provided to the array power rail 202A for data retention in the memory arrays 212(1)-212(N).

Then, as shown in state entry 1002(3) in FIG. 10A, the high impedance path selection signal 517 is controlled to be a logic '0' to turn off the PFET 506(2) in the second logic power impedance path 518H. The PFET 514(2) is already turned off in the second memory power impedance path 520H. The memory retention signal 526 is controlled to be a logic '1' to turn on the NFET 524 to behave in a diode-drop mode.

Then, as shown in state entry 1002(4) in FIG. 10A, while the NFET 524 is turned on, the high impedance path selection signal 517 is controlled to be logic '1' to turn on the PFET 514(2) in the second memory power impedance path 520H. Then, the array power rail 202A is coupled to the memory power rail 202M through the NFET 524 and the PFET 514(2) in the second memory power impedance path 520H. The array power rail 202A is then allowed to ramp-up to the voltage of the memory power rail 202M as shown in state entry 1002(5) in FIG. 10A. The memory power rail enable signal 508M is then activated to couple the array power rail 202A through the PFET 514(1) to the memory power rail 202M in state entry 1002(6) in FIG. 10A.

Note that the transition from coupling the memory power rail 202M to the array power rail 202A to coupling the logic power rail 202L to the array power rail 202A in the power rail selection circuit 216(3) in FIG. 9 can be controlled by the power rail control circuit 224. This is shown in state entries 1004(1)-1004(6) in the table 1000(2) in FIG. 10B, which are shown in the table 1000(2).

Selective coupling of power rails to a memory domain(s) in a processor-based system, such as to reduce or avoid the need to provide intentional decoupling capacitance in a logic domain(s), may be provided in or integrated into in any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a computer, a portable computer, a desktop computer, a server computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 11:
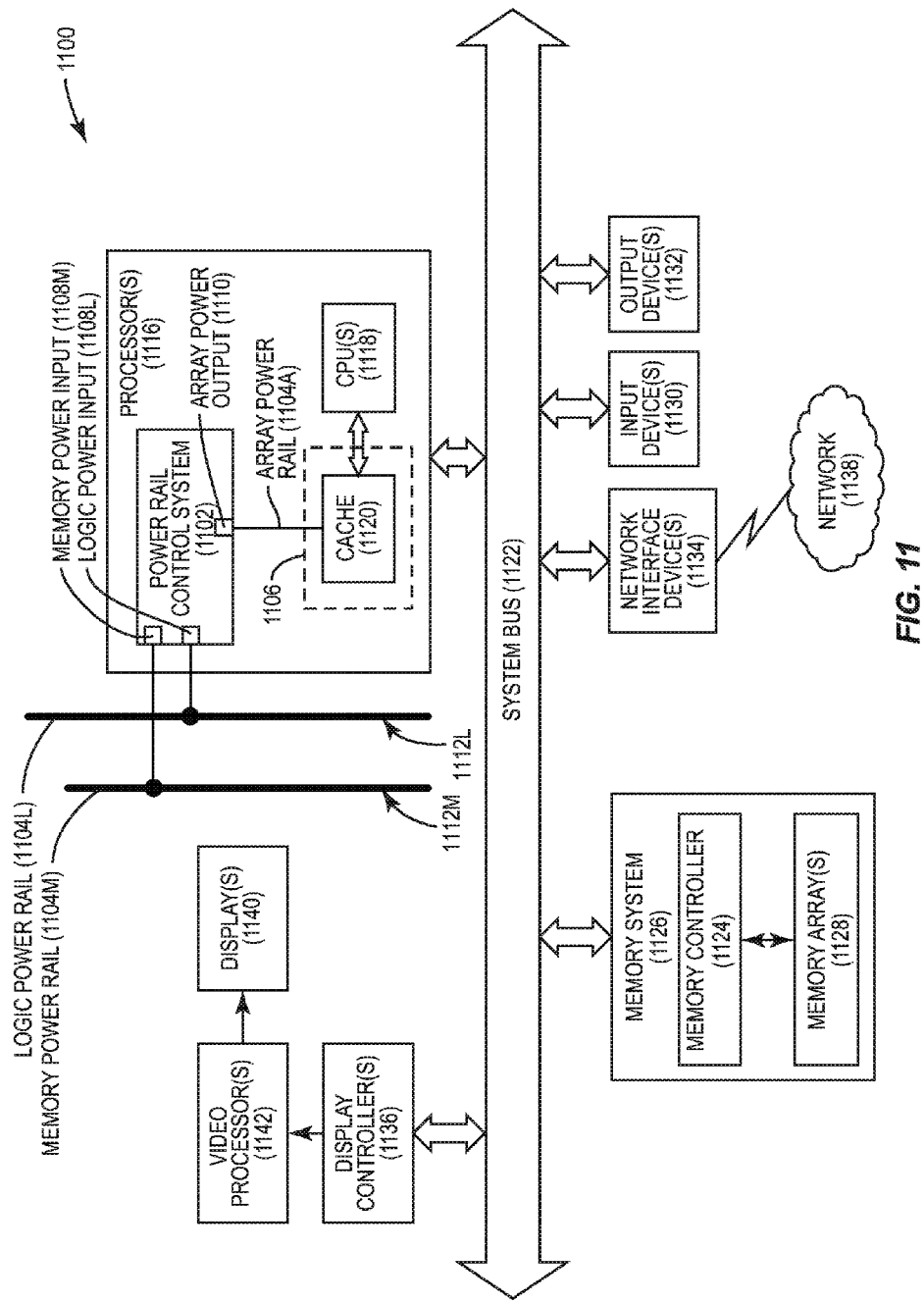
FIG. 11 is a block diagram of an exemplary processor-based system that can include the processor-based system in FIG. 2 selectively coupling a power rail selection circuit or a memory power rail to a memory domain, according to any of the aspects disclosed herein.

In this regard, FIG. 11 illustrates an example of a processor-based system 1100 that includes a power rail control system 1102 configured to control the selective coupling of a logic power rail 1104L or memory power rail 1104M to a memory domain 1106, such as to reduce intentional decoupling capacitance in a logic domain according to any of the particular aspects discussed above. In this example, the memory domain 1106 includes a cache memory 1120 that is included in a processor 1116 and coupled to one or more CPU(s) 1118 for rapid access to temporarily stored data. For example, the power rail control system 1102 can include the power rail control circuit 224, and any of the power rail selection circuits 216, 216(1), 216(2), 216(3) in FIGS. 2, 5, 7, and 9, as examples. The power rail control system 1102 has a logic power input 1108L coupled to the logic power rail 1104L and a memory power input 1108M coupled to the memory power rail 1104M. The power rail control system 1102 has an array power output 1110 coupled to an array power rail 1104A configured to provide power to the memory domain 1106. The power rail control system 1102 is configured to provide logic power 1112L from a logic power supply (not shown) when the voltage of the logic power 1112L is at or above the minimum operating voltage of the memory domain 1106. The power rail control system 1102 is configured to provide memory power 1112M from a memory power supply (not shown) when the voltage of the logic power 1112L is below the minimum operating voltage of the memory domain 1106. Any of the features and examples described above can be provided in the power rail control system 1102.

In this example, the processor-based system 1100 also includes one or more processors 1116, each including one or more CPUs 1118. The processors 1116 include the cache memory 1120 coupled to the CPU(s) 1118 for rapid access to temporarily stored data. The processors 1116 are coupled to a system bus 1122 and can intercouple master and slave devices included in the processor-based system 1100. As is well known, the processors 1116 communicate with these other devices by exchanging address, control, and data information over the system bus 1122. For example, the processors 1116 can communicate bus transaction requests to a memory controller 1124 in a memory system 1126 as an example of a slave device. Although not illustrated in FIG. 11, multiple system buses 1122 could be provided, wherein each system bus 1122 constitutes a different fabric. In this example, the memory controller 1124 is configured to provide memory access requests to one or more memory arrays 1128 in the memory system 1126.

Other devices can be connected to the system bus 1122. As illustrated in FIG. 11, these devices can include one or more input devices 1130, one or more output devices 1132, one or more network interface devices 1134, and one or more display controllers 1136, as examples. The input device(s) 1130 can include any type of input device, including but not limited to input keys, switches, voice processors, etc. The output device(s) 1132 can include any type of output device, including but not limited to audio, video, other visual indicators, etc. The network interface device(s) 1134 can be any devices configured to allow exchange of data to and from a network 1138. The network 1138 can be any type of network, including but not limited to a wired or wireless network, a private or public network, a local area network (LAN), a wireless local area network (WLAN), a wide area network (WAN), a BLUETOOTH™ network, and the Internet. The network interface device(s) 1134 can be configured to support any type of communications protocol desired.

The processors 1116 may also be configured to access the display controller(s) 1136 over the system bus 1122 to control information sent to one or more displays 1140. The display controller(s) 1136 sends information to the display(s) 1140 to be displayed via one or more video processors 1142, which process the information to be displayed into a format suitable for the display(s) 1140. The display(s) 1140 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A power rail selection circuit for a processor-based system, comprising:

a logic power input coupled to a logic power rail configured to receive logic power from a logic power supply configured to provide the logic power to a logic domain;
a memory power input coupled to a memory power rail configured to receive memory power from a memory power supply;
an array power output coupled to an array power rail coupled to at least one memory array in a memory domain; and
a control circuit configured to:
couple the logic power input to the array power output to couple the logic power rail to the array power rail, in response to an operating voltage at the logic power rail being at or above a minimum operating voltage of the memory domain; and
couple the memory power input to the array power output to couple the memory power rail to the array power rail, in response to the operating voltage at the logic power rail being below the minimum operating voltage of the memory domain; and
wherein the control circuit comprises:
a logic power selection circuit coupled to the logic power input, the logic power selection circuit configured to couple the logic power rail to the array power rail, in response to the operating voltage at the logic power rail being at or above the minimum operating voltage of the memory domain; and
a memory power selection circuit coupled to the memory power input, the memory power selection circuit configured to couple the memory power rail to the array power rail, in response to the operating voltage at the logic power rail being below the minimum operating voltage of the memory domain such that both the logic power selection circuit and the memory power selection circuit may couple respective power rails to the array power rail simultaneously without creating a short circuit.

2. The power rail selection circuit of claim 1, wherein the control circuit is further configured to couple an intrinsic decoupling capacitance of the at least one memory array to the logic power rail, to couple the intrinsic decoupling capacitance of the at least one memory array to the logic domain coupled to the logic power rail.

3. The power rail selection circuit of claim 1, wherein the control circuit is further configured to:
decouple the logic power input from the array power output to decouple the logic power rail from the array power rail, in response to the operating voltage at the logic power rail being below the minimum operating voltage of the memory domain; and
decouple the memory power input from the array power output to decouple the memory power rail from the array power rail in response to the operating voltage at the logic power rail being at or above the minimum operating voltage of the memory domain.

4. The power rail selection circuit of claim 3, wherein the control circuit is configured to simultaneously couple the logic power input to the array power output to couple the logic power rail to the array power rail, and decouple the memory power input from the array power output, to decouple the memory power rail from the array power rail, in response to the operating voltage at the logic power rail being at or above the minimum operating voltage of the memory domain.

5. The power rail selection circuit of claim 3, wherein the control circuit is configured to simultaneously couple the memory power input to the array power output to couple the memory power rail to the array power rail, and decouple the logic power input from the array power output, to decouple the logic power rail from the array power rail, in response to the operating voltage at the logic power rail being below the minimum operating voltage of the memory domain.

6. The power rail selection circuit of claim 3, further comprising:
a select control circuit configured to:
receive a memory select signal indicating a memory select enable state in response to the operating voltage at the logic power rail being below the minimum operating voltage of the memory domain;
generate a memory make signal indicating a memory make state in response to the memory select signal indicating the memory select enable state;
receive a logic select signal indicating a logic select enable state in response to the operating voltage at the logic power rail being at or above the minimum operating voltage of the memory domain; and
generate a logic make signal indicating a logic make state in response to the logic select signal indicating the logic select enable state;
the memory power selection circuit comprising a memory pass gate, comprising:
a first memory power transistor coupled to the memory power input and the array power output, the first memory power transistor configured to receive the memory make signal and provide the memory power from the memory power input to the array power output over a first memory power impedance path, in response to a memory power rail enable signal indicating a memory power rail enable state; and
a second memory power transistor coupled to the memory power input and the array power output, the second memory power transistor configured to receive the memory power rail enable signal and provide the memory power from the memory power input to the array power output over a second memory power impedance path having a higher impedance than the first memory power impedance path in response to the memory make signal indicating the memory make state; and
the logic power selection circuit comprising a memory pass gate, comprising:
a first logic power transistor coupled to the logic power input and the array power output, the first logic power transistor configured to receive the logic make signal and provide the logic power from the logic power input to the array power output over a first logic power impedance path, in response to a logic power rail enable signal indicating a logic power rail enable state; and
a second logic power transistor coupled to the logic power input and the array power output, the second logic power transistor configured to receive the logic power rail enable signal and provide the logic power from the logic power input to the array power output over a second logic power impedance path having a higher impedance than the first logic power impedance path, in response to the logic make signal indicating the logic make state.

7. The power rail selection circuit of claim 1, wherein the logic power selection circuit is configured to couple the logic power input to the array power output to couple the logic power rail to the array power rail before controlling the memory power selection circuit to decouple the memory power input from the array power output to decouple the memory power rail from the array power rail, in response to the operating voltage at the logic power rail being at or above the minimum operating voltage of the memory domain.

8. The power rail selection circuit of claim 1, wherein the memory power selection circuit is configured to couple the memory power input to the array power output to couple the memory power rail to the array power rail before controlling the logic power selection circuit to decouple the logic power input from the array power output to decouple the logic power rail from the array power rail, in response to the operating voltage at the logic power rail being below the minimum operating voltage of the memory domain.

9. The power rail selection circuit of claim 1, wherein the control circuit is further configured to:
receive a memory power rail enable signal, the memory power rail enable signal indicating a memory power rail enable state in response to the operating voltage at the logic power rail being below the minimum operating voltage of the memory domain; and
receive a logic power rail enable signal, the logic power rail enable signal indicating a logic power rail enable state in response to the operating voltage at the logic power rail being at or above the minimum operating voltage of the memory domain;
the memory power selection circuit configured to couple the memory power rail to the array power rail based on the memory power rail enable signal indicating the memory power rail enable state; and
the logic power selection circuit configured to couple the logic power rail to the array power rail based on the logic power rail enable signal indicating the logic power rail enable state.

10. The power rail selection circuit of claim 1, further comprising:
a select control circuit configured to:
receive a high impedance path selection signal indicating a logic high impedance path in response to the operating voltage at the logic power rail being at or above the minimum operating voltage of the memory domain, and a memory high impedance path in response to the operating voltage at the logic power rail being below the minimum operating voltage of the memory domain;
receive a logic/memory toggle signal indicating a logic select enable state in response to the operating voltage at the logic power rail being at or above the minimum operating voltage of the memory domain, and a memory select enable state in response to the operating voltage at the logic power rail being below the minimum operating voltage of the memory domain;
generate a memory make signal indicating a memory make state in response to the high impedance path selection signal indicating the memory high impedance path and the logic/memory toggle signal indicating the memory select enable state; and
generate a logic make signal indicating a logic make state in response to the high impedance path selection signal indicating the logic high impedance path and the logic/memory toggle signal indicating the logic select enable state;
the memory power selection circuit comprising a memory pass gate, comprising:
a first memory power transistor coupled to the memory power input and the array power output, the first memory power transistor configured to receive the memory make signal and provide the memory power from the memory power input to the array power output over a first memory power impedance path, in response to the memory make signal indicating the memory make state; and
a second memory power transistor coupled to the memory power input and the array power output, the second memory power transistor configured to receive a memory power rail enable signal and provide the memory power from the memory power input to the array power output over a second memory power impedance path having a higher impedance than the first memory power impedance path in response to the memory make signal; and
the logic power selection circuit comprising a memory pass gate, comprising:
a first logic power transistor coupled to the logic power input and the array power output, the first logic power transistor configured to receive the logic make signal and provide the logic power from the logic power input to the array power output over a first logic power impedance path, in response to the logic make signal indicating the logic make state; and
a second logic power transistor coupled to the logic power input and the array power output, the second logic power transistor configured to receive a logic power rail enable signal and provide the logic power from the logic power input to the array power output over a second logic power impedance path having a higher impedance than the first logic power impedance path, in response to the logic make signal.

11. The power rail selection circuit of claim 10, wherein the select control circuit is further configured to:
generate the memory make signal indicating a memory break state in response to the high impedance path selection signal indicating the logic high impedance path and the logic/memory toggle signal indicating the logic select enable state; and
generate the logic make signal indicating a logic break state in response to the high impedance path selection signal indicating the memory high impedance path and the logic/memory toggle signal indicating the memory select enable state.

12. The power rail selection circuit of claim 10, wherein the select control circuit is further configured to generate the memory make signal indicating a memory break state in response to receiving the logic/memory toggle signal indicating the logic select enable state.

13. The power rail selection circuit of claim 1, further comprising a memory retention circuit coupled between the memory power rail and the array power rail, the memory retention circuit configured to be controlled by a memory retention signal to couple the memory power rail to the array power rail in a diode-drop mode to reduce cross-conduction current between the memory power rail and the logic power rail.

14. The power rail selection circuit of claim 1 integrated into a system-on-a-chip (SoC).

15. The power rail selection circuit of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a server computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

16. A power rail selection circuit for a processor-based system, comprising:
  means for coupling to a logic power rail configured to receive power from a logic power supply;
  means for coupling to a memory power rail configured to receive power from a memory power supply;
  means for coupling to an array power rail coupled to at least one memory array in a memory domain; and
  a control circuit comprising:
    means for coupling the means for coupling to the logic power rail to the means for coupling to the array power rail configured to couple the logic power rail to the array power rail, in response to an operating voltage at the logic power rail being at or above a minimum operating voltage of the memory domain;
    means for coupling the means for coupling to the memory power rail to the means for coupling to the array power rail configured to couple the memory power rail to the array power rail, in response to the operating voltage at the logic power rail being below the minimum operating voltage of the memory domain;
    a logic power selection circuit coupled to the means for coupling to the logic power rail, the logic power selection circuit configured to couple the logic power rail to the array power rail, in response to the operating voltage at the logic power rail being at or above the minimum operating voltage of the memory domain; and
    a memory power selection circuit coupled to the means for coupling to the memory power rail, the memory power selection circuit configured to couple the memory power rail to the array power rail, in response to the operating voltage at the logic power rail being below the minimum operating voltage of the memory domain such that both the logic power selection circuit and the memory power selection circuit may couple respective power rails to the array power rail simultaneously without creating a short circuit.

17. A method for selectively coupling a logic power rail and a memory power rail to an array power rail coupled to at least one memory array in a processor-based system, for coupling power from the logic power rail or the memory power rail to the at least one memory array, comprising:
  receiving logic power from a logic power supply over the logic power rail;
  receiving memory power from a memory power supply over the memory power rail;
  coupling the logic power rail to the array power rail coupled to at least one memory array in a memory domain to provide the received logic power to the array power rail, in response to an operating voltage at the logic power rail being at or above a minimum operating voltage of the memory domain;
  coupling the memory power rail to the array power rail coupled to the at least one memory array in the memory domain to provide the received memory power to the array power rail, in response to the operating voltage at the logic power rail being below the minimum operating voltage of the memory domain;
  using a logic power selection circuit configured to couple the logic power rail to the array power rail, in response to the operating voltage at the logic power rail being at or above the minimum operating voltage of the memory domain; and
  using a memory power selection circuit configured to couple the memory power rail to the array power rail, in response to the operating voltage at the logic power rail being below the minimum operating voltage of the memory domain such that both the logic power selection circuit and the memory power selection circuit may couple respective power rails to the array power rail simultaneously without creating a short circuit.

18. The method of claim 17, further comprising:
  decoupling the logic power rail from the array power rail, in response to the operating voltage at the logic power rail being below the minimum operating voltage of the memory domain; and
  decoupling the memory power rail from the array power rail in response to the operating voltage at the logic power rail being at or above the minimum operating voltage of the memory domain.

19. The method of claim 18, comprising simultaneously coupling the logic power rail to the array power rail and decoupling the memory power rail from the array power rail, in response to the operating voltage at the logic power rail being at or above the minimum operating voltage of the memory domain.

20. The method of claim 18, comprising simultaneously coupling the memory power rail to the array power rail and decoupling the logic power rail from the array power rail, in response to the operating voltage at the logic power rail being below the minimum operating voltage of the memory domain.

21. The method of claim 18, comprising coupling the logic power rail to the array power rail before decoupling the memory power rail from the array power rail, in response to the operating voltage at the logic power rail being at or above the minimum operating voltage of the memory domain.

22. The method of claim 18, comprising coupling the memory power rail to the array power rail before decoupling the logic power rail from the array power rail, in response to the operating voltage at the logic power rail being below the minimum operating voltage of the memory domain.

23. The method of claim 17, further comprising:
  (a) receiving a high impedance path selection signal indicating a memory high impedance path in response to the operating voltage at the logic power rail being below the minimum operating voltage of the memory domain;
  (b) receiving a logic/memory toggle signal indicating a memory select enable state in response to the operating voltage at the logic power rail being below the minimum operating voltage of the memory domain;
  (c) generating a memory make signal indicating a memory make state in response to the high impedance path selection signal indicating the memory high impedance path and the logic/memory toggle signal indicating the memory select enable state;

(d) coupling a memory power input and an array power output over a first memory power impedance path, in response to the memory make signal indicating the memory make state; and (e) coupling the memory power input and the array power output over a second memory power impedance path having a higher impedance than the first memory power impedance path in response to the memory make signal.

24. The method of claim 23, comprising performing step (e) before performing step (d).

25. The method of claim 23, further comprising:
(f) generating the memory make signal indicating a memory break state in response to the high impedance path selection signal indicating a logic high impedance path and the logic/memory toggle signal indicating a logic select enable state;
(g) decoupling the memory power from the memory power rail to the array power rail over the first memory power impedance path in response to a memory power rail enable signal indicating a memory power rail disable state and the memory make signal indicating the memory break state; and
(h) decoupling the memory power from the memory power rail to the array power rail over the second memory power impedance path, in response to the memory make signal indicating the memory break state.

26. The method of claim 25, comprising performing step (g) before performing step (h).

27. The method of claim 17, further comprising:
(a) receiving a high impedance path selection signal indicating a logic high impedance path in response to the operating voltage at the logic power rail being at or above the minimum operating voltage of the memory domain;
(b) receiving a logic/memory toggle signal indicating a logic select enable state in response to the operating voltage at the logic power rail being at or above the minimum operating voltage of the memory domain; and
(c) generating a logic make signal indicating a logic make state in response to the high impedance path selection signal indicating the logic high impedance path and the logic/memory toggle signal indicating the logic select enable state;
(d) coupling a logic power input and an array power output over a first logic power impedance path, in response to the logic make signal indicating the logic make state; and
(e) coupling the logic power input and the array power output over a second logic power impedance path having a higher impedance than the first logic power impedance path in response to the logic make signal.

28. The method of claim 27, comprising performing step (d) before performing step (e).

29. The method of claim 27, further comprising:
(f) generating the logic make signal indicating a logic break state in response to the high impedance path selection signal indicating a memory high impedance path and the logic/memory toggle signal indicating a memory select enable state;
(g) decoupling the logic power from the logic power rail to the array power rail over the first logic power impedance path in response to a logic power rail enable signal indicating a logic power rail disable state and the logic make signal indicating the logic break state; and
(h) decoupling the logic power from the logic power rail to the array power rail over the second logic power impedance path, in response to the logic make signal indicating the logic break state.

30. The method of claim 29, comprising performing step (h) before performing step (g).

31. The method of claim 17, further comprising:
(a) receiving a memory select signal indicating a memory select enable state in response to the operating voltage at the logic power rail being below the minimum operating voltage of the memory domain;
(b) generating a memory make signal indicating a memory make state in response to the memory select signal indicating the memory select enable state;
(c) coupling a memory power input and an array power output over a first memory power impedance path, in response to a memory power rail enable signal indicating a memory power rail enable state; and
(d) coupling the memory power input and the array power output over a second memory power impedance path having a higher impedance than the first memory power impedance path in response to the memory make signal indicating the memory make state.

32. The method of claim 31, comprising performing step (c) before performing step (d).

33. The method of claim 31, further comprising:
(e) receiving the memory select signal indicating a memory select disable state in response to the operating voltage at the logic power rail being at or above the minimum operating voltage of the memory domain;
(f) generating the memory make signal indicating a memory break state in response to the memory select signal indicating the memory select disable state;
(g) decoupling the memory power input and the array power output over the first memory power impedance path, in response to the memory power rail enable signal indicating a memory power rail disable state; and
(h) decoupling the memory power input and the array power output over the second memory power impedance path having the higher impedance than the first memory power impedance path in response to the memory make signal indicating the memory break state.

34. The method of claim 33, comprising performing step (h) before performing step (g).

35. The method of claim 31, further comprising:
(e) receiving a logic select signal indicating a logic select enable state in response to the operating voltage at the logic power rail being at or above the minimum operating voltage of the memory domain;
(f) generating a logic make signal indicating a logic make state in response to the logic select signal indicating the logic select enable state;
(g) coupling a logic power input and the array power output over a first logic power impedance path, in response to the logic make signal indicating the logic make state; and
(h) coupling the logic power input and the array power output over a second logic power impedance path having a higher impedance than the first logic power impedance path, in response to a logic power rail enable signal indicating a logic power rail enable state.

36. The method of claim 35, comprising performing step (g) before performing step (h).

37. The method of claim 31, further comprising:
(e) receiving a logic select signal indicating a logic select disable state in response to the operating voltage at the logic power rail being below the minimum operating voltage of the memory domain;

(f) generating a logic make signal indicating a logic break state in response to the logic select signal indicating the logic select disable state;

(g) decoupling a logic power input and the array power output over a first logic power impedance path, in response to a logic power rail enable signal indicating a logic power rail disable state; and (h) decoupling the logic power input and the array power output over a second logic power impedance path having a higher impedance than the first logic power impedance path in response to the logic make signal indicating the logic break state.

38. The method of claim 37, comprising performing step (h) before performing step (g).

39. A power rail control system for a processor-based system, comprising:
a power rail control circuit configured to:
generate a memory power rail enable signal indicating a memory power rail enable state in response to an operating voltage at a logic power rail receiving logic power from a logic power supply and providing the received logic power to a logic domain, being below a minimum operating voltage of a memory domain; and
generate a logic power rail enable signal, the logic power rail enable signal indicating a logic power rail enable state in response to the operating voltage at the logic power rail being at or above the minimum operating voltage of the memory domain; and
a power rail selection circuit configured to:
couple the logic power rail receiving the logic power from the logic power supply to an array power rail coupled to at least one memory array in the memory domain to provide the logic power to the at least one memory array, in response to the logic power rail enable signal indicating the logic power rail enable state; and
couple a memory power rail receiving memory power from a memory power supply to the array power rail coupled to the at least one memory array in the memory domain to provide the memory power to the at least one memory array, in response to the memory power rail enable signal indicating the memory power rail enable state; and
wherein the power rail selection circuit comprises:
a logic power selection circuit configured to couple the logic power rail to the array power rail, in response to the logic power rail enable signal indicating the logic power rail enable state; and
a memory power selection circuit configured to couple the memory power rail to the array power rail, in response to the memory power rail enable signal indicating the memory power rail enable state such that both the logic power selection circuit and the memory power selection circuit may couple respective power rails to the array power rail simultaneously without creating a short circuit.

40. The power rail control system of claim 39, wherein the power rail selection circuit is configured to couple the logic power rail to the at least one memory array to couple an intrinsic decoupling capacitance of the at least one memory array to the logic domain.

41. The power rail control system of claim 39, wherein:
the power rail control circuit is further configured to:
generate the memory power rail enable signal indicating a memory power rail disable state in response to the operating voltage at the logic power rail receiving the logic power from the logic power supply and providing the received logic power to the logic domain, being at or above the minimum operating voltage of the memory domain; and
generate the logic power rail enable signal indicating a logic power rail disable state in response to the operating voltage at the logic power rail being below the minimum operating voltage of the memory domain; and
the power rail selection circuit is further configured to:
decouple the logic power rail receiving the logic power from the array power rail, in response to the logic power rail enable signal indicating the logic power rail disable state; and
decouple the memory power rail from the array power rail, in response to the memory power rail enable signal indicating the memory power rail disable state.

42. The power rail control system of claim 41, wherein the power rail selection circuit is configured to simultaneously couple a logic power input coupled to the logic power rail to an array power output coupled to the array power rail, to couple the logic power rail to the array power rail and decouple a memory power input from the array power output to decouple the memory power rail from the array power rail, in response to the logic power rail enable signal indicating the logic power rail enable state and the memory power rail enable signal indicating the memory power rail disable state.

43. The power rail control system of claim 41, wherein the power rail selection circuit is configured to simultaneously couple a memory power input coupled to the memory power rail to an array power output coupled to the array power rail, to couple the memory power rail to the array power rail and decouple a logic power input from the array power output to decouple the logic power rail from the array power rail, in response to the logic power rail enable signal indicating the logic power rail disable state and the memory power rail enable signal indicating the memory power rail enable state.

44. The power rail control system of claim 39, wherein the power rail control circuit is further configured to generate the logic power rail enable signal indicating the logic power rail enable state before generating the memory power rail enable signal indicating the memory power rail enable state.

45. The power rail control system of claim 44, wherein the power rail control circuit is further configured to generate the memory power rail enable signal indicating the memory power rail enable state before generating the logic power rail enable signal indicating the logic power rail enable state.

46. The power rail control system of claim 39, wherein:
the power rail control circuit is further configured to generate a memory retention signal in a diode-drop mode to reduce cross-conduction current between the memory power rail and the logic power rail; and
the power rail selection circuit further comprises a memory retention circuit coupled between the memory power rail and the array power rail, the memory retention circuit configured to be controlled by the memory retention signal to couple the memory power rail to the array power rail in the diode-drop mode to reduce the cross-conduction current between the memory power rail and the logic power rail.

* * * * *